United States Patent
Bathul et al.

(10) Patent No.: US 7,068,204 B1
(45) Date of Patent: Jun. 27, 2006

(54) SYSTEM THAT FACILITATES READING MULTI-LEVEL DATA IN NON-VOLATILE MEMORY

(75) Inventors: Fatima Bathul, Cupertino, CA (US); Darlene Hamilton, San Jose, CA (US); Eugen Gershon, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/951,410

(22) Filed: Sep. 28, 2004

(51) Int. Cl.
*H03M 1/12* (2006.01)

(52) U.S. Cl. ........................... 341/155; 341/131
(58) Field of Classification Search ............... 341/155, 341/131, 163, 118, 141, 130
See application file for complete search history.

(56) References Cited

U.S. PATENT DOCUMENTS

| | | | |
|---|---|---|---|
| 5,084,700 A * | 1/1992 | Christopher | 341/118 |
| 5,241,312 A * | 8/1993 | Long | 341/163 |
| 5,245,341 A * | 9/1993 | Maeder | 341/131 |
| 5,629,892 A | 5/1997 | Tang | |
| 5,793,318 A * | 8/1998 | Jewett | 341/118 |
| 5,999,451 A | 12/1999 | Lin et al. | |
| 6,317,364 B1 | 11/2001 | Guterman et al. | |
| 6,433,716 B1 * | 8/2002 | Arai et al. | 341/141 |
| 6,462,986 B1 | 10/2002 | Khan | |
| 6,504,398 B1 * | 1/2003 | Lien et al. | 326/41 |
| 6,512,701 B1 | 1/2003 | Hamilton et al. | |
| 6,515,610 B1 * | 2/2003 | McCall et al. | 341/155 |
| 6,584,017 B1 | 6/2003 | Maayan et al. | |
| 6,593,870 B1 * | 7/2003 | Dummermuth et al. | 341/155 |
| 6,684,173 B1 | 1/2004 | Kessenich et al. | |
| 6,700,815 B1 | 3/2004 | Le et al. | |
| 6,700,818 B1 | 3/2004 | Shappir et al. | |
| 6,834,073 B1 * | 12/2004 | Miller et al. | 375/130 |
| 6,891,490 B1 * | 5/2005 | Hales | 341/155 |
| 2004/0010324 A1 * | 1/2004 | Bednar et al. | |
| 2004/0183708 A1 * | 9/2004 | Nazarian | |

* cited by examiner

*Primary Examiner*—Jean Bruner Jeanglaude
(74) *Attorney, Agent, or Firm*—Eschweiler & Associates, LLC

(57) ABSTRACT

The present invention pertains to a system that facilitates a determination of the level of a bit in a dual sided ONO flash memory cell where each of the bits of the dual sided ONO flash memory cell can be programmed to multiple levels. One or more aspects of the present invention take into consideration the affect that the level of charge on one bit can have on the other bit, otherwise known as complimentary bit disturb. A metric known as transconductance is utilized in making the bit level determination to provide a greater degree of resolution and accuracy. In this manner, determining the bit level in accordance with one or more aspects of the present invention mitigates false or erroneous reads.

15 Claims, 15 Drawing Sheets

← 600

| 602 | 604 | 606 | 608 | 610 | 612 |

| LEFT BIT STATUS | RIGHT BIT STATUS | LEFT BIT | RIGHT BIT | READ LEFT BIT CASE | READ RIGHT BIT CASE |
|---|---|---|---|---|---|
| BLANK | BLANK | 1 | 1 | 11 | 11 |
| BLANK | LEVEL 2 | 1 | 2 | 12 | 21 |
| BLANK | LEVEL 3 | 1 | 3 | 13 | 31 |
| BLANK | LEVEL 4 | 1 | 4 | 14 | 41 |
| LEVEL 2 | BLANK | 2 | 1 | 21 | 12 |
| LEVEL 2 | LEVEL 2 | 2 | 2 | 22 | 22 |
| LEVEL 2 | LEVEL 3 | 2 | 3 | 23 | 32 |
| LEVEL 2 | LEVEL 4 | 2 | 4 | 24 | 42 |
| LEVEL 3 | BLANK | 3 | 1 | 31 | 13 |
| LEVEL 3 | LEVEL 2 | 3 | 2 | 32 | 23 |
| LEVEL 3 | LEVEL 3 | 3 | 3 | 33 | 33 |
| LEVEL 3 | LEVEL 4 | 3 | 4 | 34 | 43 |
| LEVEL 4 | BLANK | 4 | 1 | 41 | 14 |
| LEVEL 4 | LEVEL 2 | 4 | 2 | 42 | 24 |
| LEVEL 4 | LEVEL 3 | 4 | 3 | 43 | 34 |
| LEVEL 4 | LEVEL 4 | 4 | 4 | 44 | 44 |

Fig. 6

SYSTEM THAT FACILITATES READING MULTI-LEVEL DATA IN NON-VOLATILE MEMORY

FIELD OF INVENTION

The present invention relates generally to memory for electronic systems and the like, and in particular to a system that facilitates reading stored charges for determining the status of bits of data represented thereby.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc. Flash memory is generally constructed of many memory cells where single bits of data are stored in and read out of respective memory cells.

Individual memory cells are generally organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

A relatively modern memory technology is dual sided ONO flash memory, which allows multiple bits to be stored in a single cell. In this technology, a memory cell is essentially split into two identical (mirrored) parts, each of which is formulated for storing one of two independent bits. Each dual sided ONO flash memory cell, like a traditional cell, has a gate with a source and a drain. However, unlike a traditional stacked gate cell in which the source is always connected to an electrical source and the drain is always connected to an electrical drain, respective dual sided ONO flash memory cells can have the connections of the source and drain reversed during operation to permit the storing of two bits.

In a virtual ground type architecture, dual sided ONO flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto individual semiconductor wafers (or die).

One technique to pack more memory cells/transistors into a smaller area is to form their structures and component elements closer together. Forming bitlines closer together, for example, shortens the length of a channel defined therebetween and allows more devices to be formed in the same area. This can, however, cause certain undesirable phenomena to become more prevalent. For example, isolating two bits or charges stored within a charge trapping layer becomes increasingly difficult as the channel length is decreased and the bits are brought closer together. In this manner, the bits or charges can contaminate one another, causing operations to be performed on the bits to be more challenging and introducing a greater opportunity for error. The affect that bits can have on one another is sometimes referred to complimentary bit disturb or CBD. Accordingly, it would be desirable to be able to operate on, and in particular, to read charges from a charge trapping layer in a manner that facilitates a more accurate determination of the status of stored bits.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to a system that facilitates determining the level or value of a bit in a multi-level dual sided ONO flash memory cell where each side or bits of the memory cell can be programmed to multiple target values or levels. One or more aspects of the present invention consider the affect that the amount of charge on one side of the cell can have on the other bit, otherwise known as complimentary bit disturb. A metric known as transconductance is utilized in making the bit level determination to provide a greater degree of resolution and accuracy. In this manner, determining the bit level in accordance with one or more aspects of the present invention mitigates false or erroneous reads.

According to one or more aspects of the present invention, an architecture is disclosed that is adapted to determine a programmed level of a bit of a core memory cell. The architecture includes a current conversion component operative to convert a measured current from the cell into a corresponding analog voltage. An analog to digital (A/D) converter is also included that is operative to convert the analog voltage into a digital value. Finally, a data processor is included that is adapted to determine the binary symbol from the digital value of the voltage.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 6 is a chart of possible combinations for a dual sided ONO flash memory cell where each of the bits can be stored at four (4) different levels.

DETAILED DESCRIPTION OF THE INVENTION

Figure 1:
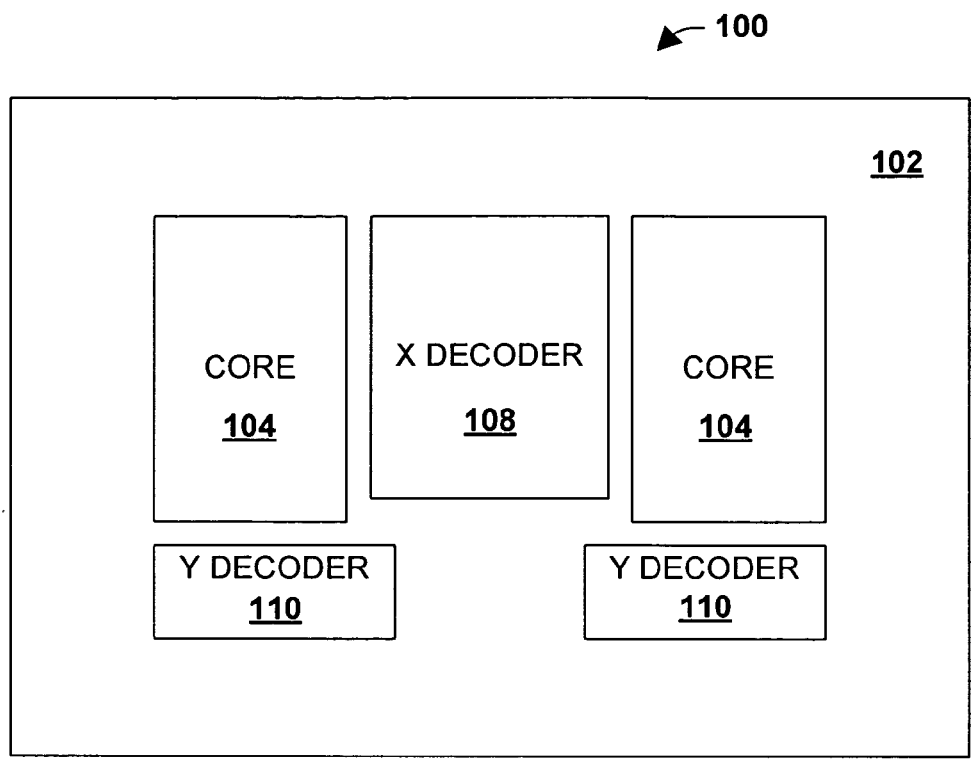
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention pertains to a system that facilitates determining the level of a bit in a dual sided ONO flash memory cell where each of the bits of the dual sided ONO flash memory cell can be programmed to multiple levels. One or more aspects of the present invention consider the affect that the level of charge on one bit can have on the other bit, otherwise known as complimentary bit disturb. A metric of transconductance is utilized in making the bit level determination to provide a greater degree of resolution and accuracy. In this manner, determining the bit level in accordance with one or more aspects of the present invention mitigates false or erroneous reads.

Referring initially to FIG. 1, a top view of an exemplary dual bit flash EEPROM 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include programming circuitry for selectively addressing the individual memory cells. The programming circuitry is represented in part by and includes one or more x-decoders 108 and one or more y-decoders 110 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
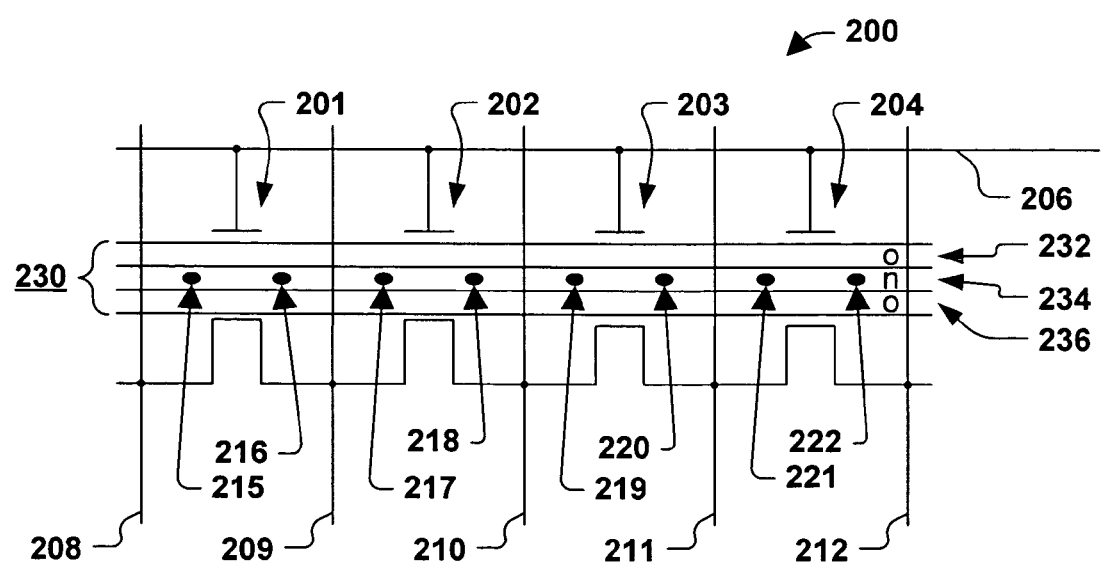
FIG. 2 is a schematic illustration of a portion of a memory core such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon wordline voltages and bitline connections, the memory cells 201 through 204 are capable of writing, reading, and erasing bits at locations 215 through 222. In addition to voltages applied to the wordline 206, reading the bit at location 215, for example, is achieved through connection of the drain to the bitline 209 and the source to the bitline 208. During programming, bitline 208 serves as the drain while 209 serves as the source. Similarly, reading of the bit at location 216 is achieved through connection of the drain to the bitline 208 and the source to the bitline 209. Storage of multiple bits is made possible, at least in part, by a charge trapping dielectric layer 230 interposed between the bitlines and the wordline. The charge trapping dielectric layer 230 includes multiple insulating layers 232, 236 (e.g., of oxide based material) that sandwich a charge trapping layer 234 (e.g., of nitride based material). Given its layer to layer composition, the charge trapping dielectric layer 230 is often referred to as an ONO layer.

The ONO layer 230 allows the different bits to be stored at multiple states or levels as well. For example, depending upon the voltage applied to the memory cells 201 through 204 by the control gate or wordline 206 during programming, varying amounts of charge can be stored at locations 215 through 222. The different amounts of charge may correspond to different bit states or levels, for example. If four different charge levels (e.g., 1, 2, 3 and 4) can be stored at each of the bit locations 215 through 222, for example, then each two-bit cell 201 through 204 can have 16 different combinations of stored data (e.g., 1× levels: 1-1, 1-2, 1-3, 1-4; 2× levels: 2-1, 2-2, 2-3, 2-4; 3× levels: 3-1, 3-2, 3-3, 3-4; 4× levels: 4-1, 4-2, 4-3 and 4-4).

Figure 3:
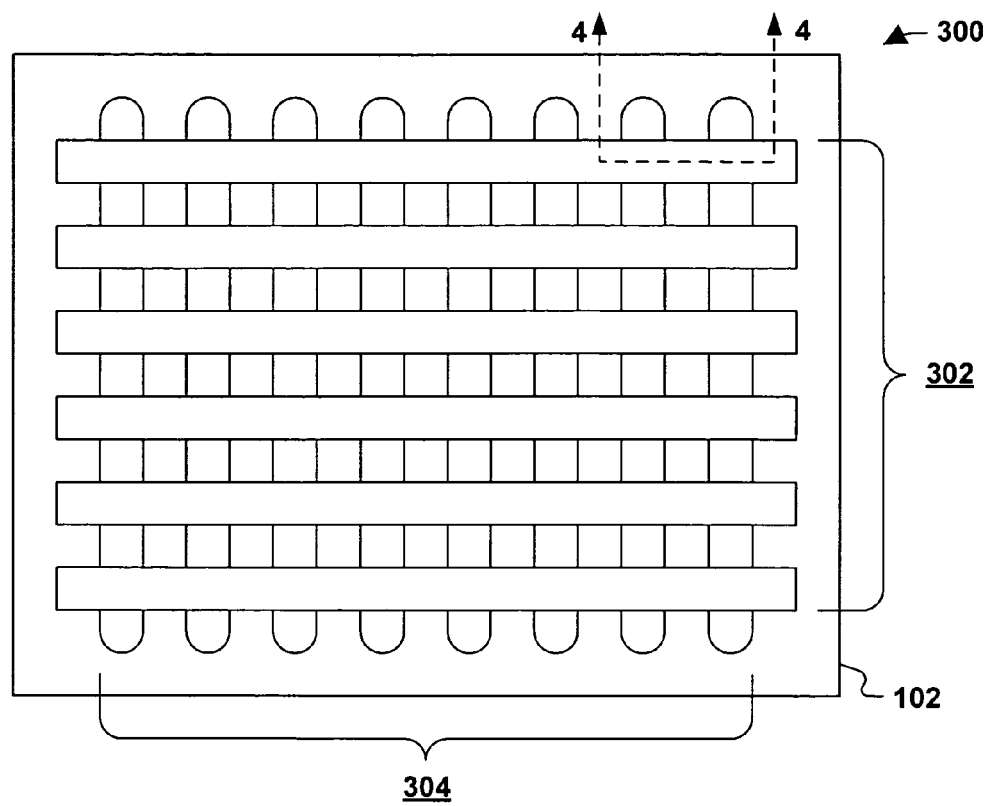
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
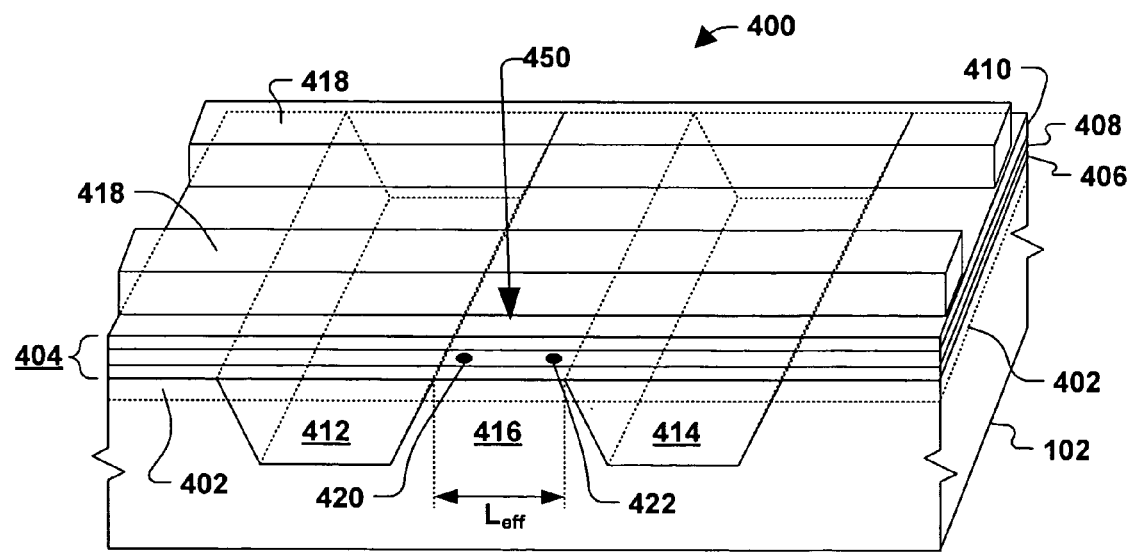
FIG. 4 is a cross-sectional isometric illustration of a portion of a dual bit flash memory, such as that taken along line 4—4 of FIG. 3.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIGS. 3, and 208 through 212 depicted in FIG. 2. The bitlines are typically formed of an implanted n-type material, such as arsenic, and may include an oxide portion (not shown) in some examples. The first and second conductive bitlines 412 and 414 are spaced apart by an effective length ($L_{eff}$) and define a channel region 416 there-between.

Conductive wordlines 418 are similarly depicted overlying the charge-trapping dielectric layer 404. It will be appreciated that any number of such wordlines can be formed over the dielectric layer 404, and that such wordlines may correspond to the wordlines 302 depicted in FIGS. 3, and 206 depicted in FIG. 2. The wordlines can be formed out of a polysilicon material, for example, where the polysilicon material may be deposited over the dielectric layer 404 and then patterned and etched.

Locations 420 and 422 indicate generally where respective charges or bits of data can be stored in one of the cells of the memory 400, and these locations may, for example, correspond to locations 215 through 222 in FIG. 2. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another. Accordingly, the degree to which the memory can be scaled, yet perform as desired, may be limited in some cases.

A dual sided ONO flash memory cell 450 is thus defined within the arrangement 400. It will be appreciated that such a memory cell may correspond to memory cells 201 through 204 depicted in FIG. 2, for example. It will be further appreciated that the charge-trapping dielectric layer 404, and more particularly the charge-trapping layer 408, may, for example, enable multiple levels or bit states to be stored at locations 420 and 422. The charge trapping layer 408 makes this possible because it is non-conductive and, thus, any charge instilled therein (e.g., via application of a wordline voltage) remains substantially localized at positions 420 and 422. This allows the memory cell 450, and correspondingly an array of such cells, to store an increased amount of data. For example, if four different charges (e.g., 1, 2, 3 and 4) can be stored at each of the two bit locations 420, 422, the cell 450 can have 16 different bit states (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 5:
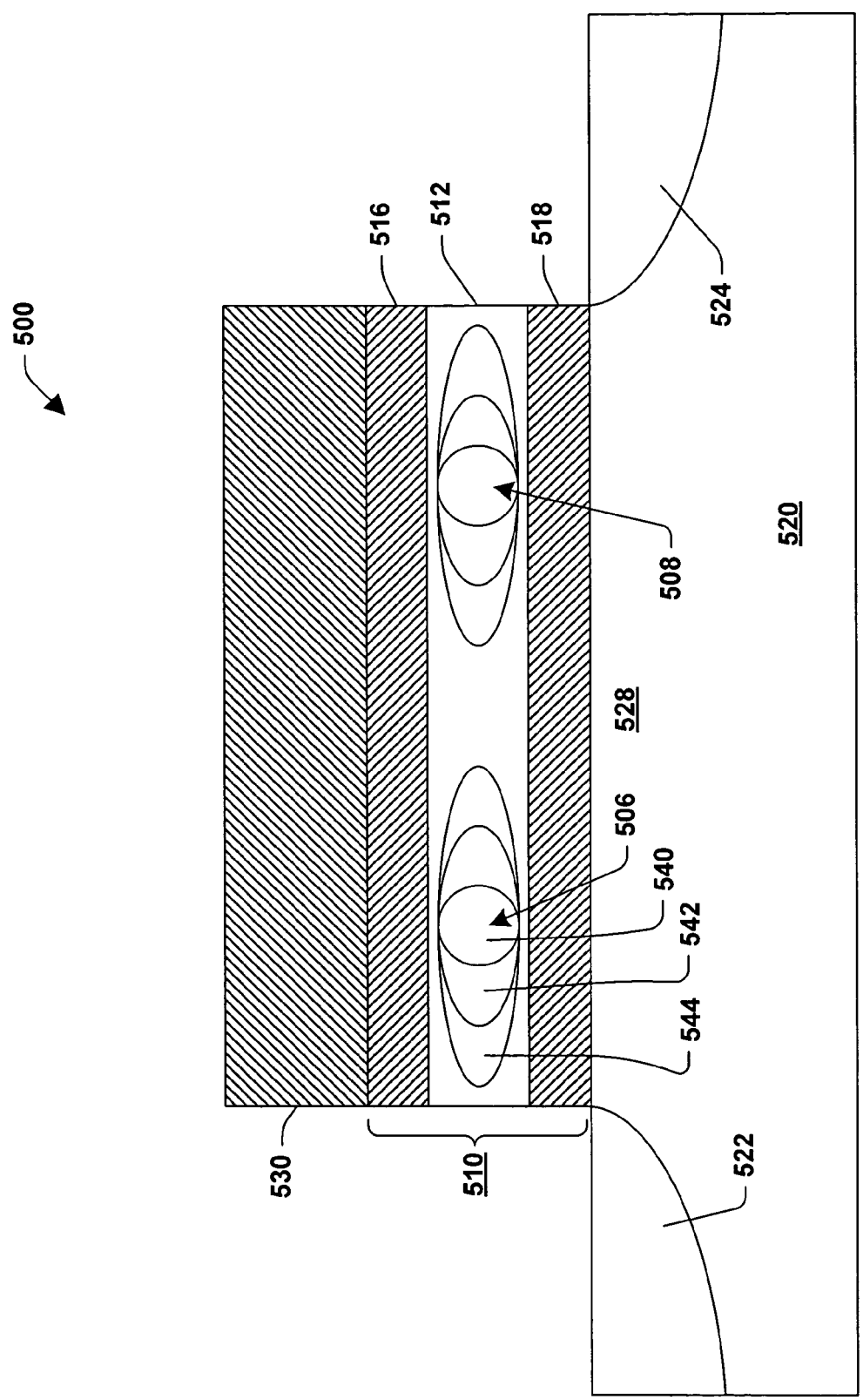
FIG. 5 is a cross-sectional view of a dual sided ONO flash memory cell wherein each of the bits can be stored at multiple levels.

FIG. 5 is a cross sectional view of a dual sided ONO flash memory cell 500 illustrating the capability of the cell to store varying degrees of charge at dual bit locations 506, 508. It will be appreciated that the memory cell 500 may, for example, correspond to the memory cells 201 through 204 depicted in FIG. 2, and the memory cell 450 depicted in FIG. 4. The cell 500 includes a charge trapping dielectric layer 510 that comprises a charge trapping layer 512 sandwiched between two dielectric layers 516, 518. The charge trapping layer 512 is formed from one or more substantially non-conductive substances, such as nitride based materials. The dielectric layers 516, 518 are similarly formed from one or more electrically insulating substances, such as oxide based materials. The layer to layer arrangement of the charge trapping dielectric layer 510 often leads it to be referred to as an ONO layer.

The charge trapping layer 510 is formed over a substrate 520 that may be formed from silicon or some other semiconductor material, for example. The substrate 520 may be selectively doped with a p-type dopant, such as boron, for example, to alter its electrical properties. In the example illustrated, the substrate 520 has buried bitlines or bitline diffusions including a first bitline diffusion 522 and a second bitline diffusion 524. The bitline diffusions 522 and 524 may, for example, be formed by an implanted n-type dopant, and may correspond to bitlines 208 through 212 in FIG. 2, and buried bitlines 412 and 414 in FIG. 4. A channel 528 is defined within the substrate between the first 522 and second 524 bitline diffusions.

Overlying the upper dielectric layer 516 of the charge trapping dielectric layer 510 is a gate 530. This gate 530 may be formed from a polysilicon material, for example, and may be doped with an n-type impurity (e.g., phosphorus) to alter its electrical behavior. The gate may, for example, correspond to the wordlines 206 in FIGS. 2, and 418 in FIG. 4. The gate 530 enables a voltage to be applied to the cell 530 such that respective charges can, among other things, be stored within the cell at locations 506, 508, depending upon the electrical connections of the bitline diffusions 522, 524.

The dual sided ONO flash memory cell 500 is generally symmetrical, thus the bitline diffusions 522 and 524 are interchangeable as acting source and drain. Thus, the first bitline diffusion 522 may serve as the source and the second bitline diffusion 524 as the drain with respect to right bit location 508 for program. Likewise, the second bitline diffusion 524 may serve as the source and the first bitline diffusion 522 as the drain for the left bit location 506 for program. The cell 500 can be programmed by applying a voltage across the gate 530 and an acting drain region and connecting an acting source region to ground.

When programming the cell 500, the acting drain region is typically biased to a potential above the acting source. As a result of the gate bias, a high electric field is applied across the charge trapping layer 512. Due to a phenomenon known as "hot electron injection", electrons pass from the acting source region through the lower dielectric layer 518 and become trapped in the charge trapping layer 512 at locations 506 or 508. It will be appreciated that a second bit can be programmed to the alternate location 508 or 506 by reversing the acting source and drain and again applying a bias to the control gate 530.

By way of example, the left bit location 506 can be programmed by applying a program voltage to the gate 530 and a drain voltage to the second bitline 522, which is an acting drain for the left location 506. The first bitline 524, which is an acting source for programming the left bit location 506, can be connected to ground, or biased to a different voltage level. The applied voltages generate a vertical electric field through the dielectric layers 518 and 516 and also through the charge trapping layer 512, and generate a lateral electric field across a length of the channel 528 from the first bitline diffusion 522 to the second bitline diffusion 524. At a given voltage, the channel 528 inverts such that electrons are drawn off the acting source (the first bitline diffusion 524 in this example) and begin accelerating towards the acting drain (the second bitline diffusion 522 in this example).

As the electrons move along the length of the channel 528, the electrons gain energy and, upon attaining enough energy, the electrons jump over the potential barrier of the bottom dielectric layer 518 and into the charge trapping layer 512, where the electrons become trapped. The probability of electrons jumping the potential barrier in this arrangement is a maximum in the area of the left bit location 506, adjacent the first bitline diffusion 522, where the electrons have gained the most energy. These accelerated electrons are termed hot electrons and, once injected into the charge trapping layer 512, stay in about the general area indicated for the left bit. The trapped electrons tend to remain generally localized due to the low conductivity of the charge trapping layer 512 and the low lateral electric field therein. Programming the right bit location 508 is similar, but the first bitline 524 operates as an acting drain and the second 522 operates as an acting source.

For a read operation, a certain voltage bias is applied across an acting drain to an acting source of the cell 500. The acting drain of the cell is a bitline, which may be connected to the drains of other cells in a byte or word group. A voltage is then applied to the gate 530 (e.g., the wordline) of the memory cell 500 in order to cause a current to flow from the acting drain to the acting source. The resulting current is measured, by which a determination is made as to the value of the data stored in the cell. For example, if the current is above a certain threshold, the bit is deemed unprogrammed or a logical one, whereas if the current is below a certain threshold, the bit is deemed to be programmed or a logical zero. A second bit can be read by reversing operations of the first and second bitline diffusions 522 and 524 for the acting drain and the acting source.

It can be appreciated that if the voltages utilized to program the left 506 and right 508 bit locations of the cell 500 are increased or sustained for longer periods of time, the number of electrons or amount of charge stored at these locations can be increased or otherwise varied. This allows the cell 500 to be utilized for additional data storage. For example, different amounts of charge can correspond to different programmed states. In the example illustrated, for instance, both the left 506 and right 508 bit locations can be said to have four different states or levels, namely 1, 2, 3 and 4, where level 1 corresponds to a situation where the locations are blank or un-programmed, and levels 2, 3 and 4 correspond to increased amounts of stored charge, respectively. With regard to the left bit location 506, for example, a level 2 may correspond to a relatively small amount of stored charge 540, while levels 3 and 4 may correspond to increasingly larger amounts of stored charge 542 and 544, respectively.

FIG. 6 is a chart 600 corresponding to such a situation where the left and right bits of a memory cell may each be one of four different states. In particular, a first column 602 of the chart 600 illustrates the status of the left bit at different programmed configurations, while a second column 604 illustrates the status of the right bit at the same programmed configurations for the cell. A third column 606 depicts what the left bit actually is, while a fourth column 608 depicts what the right bit actually is. This may, for example, correspond to logic levels for the bits. Finally, a fifth column 610 depicts a case where reading is from the left, while a sixth column 612 depicts a case where reading is from the right.

With reference back to FIG. 5, it can be appreciated that the quantity of charge stored in the respective locations 506 and 508 influences the amount of current that flows between the acting source 522, 524 and the acting drain 524, 522 during a read operation, as well as the threshold voltage (Vt) required to cause such current to flow. Thus, the level of stored bits can be determined by examining drain to source currents as well as corresponding applied threshold gate (wordline) voltages. In particular, low currents and high gate voltages may be indicative of higher and higher bit levels. Thus, measured currents and/or threshold voltages that fall within first, second, third or fourth ranges may, for example, be indicative of a level 1, level 2, level 3 or level 4, respectively for the stored bit.

It can be further appreciated, however, that even though the charge trapping layer 512 is substantially non-conductive and electrons trapped therein remain substantially localized within regions 506 or 508, the effects of complimentary bit disturb can manifest to a greater degree where dual bits can be programmed to different levels, such as 540, 542 and 544. For example, if left bit location 506 is un-programmed (level 1) or is only slightly programmed (level 2) and right bit location 508 is highly programmed (level 4), then some of the charge utilized to program the right bit may decrease the current from the left bit, causing the left bit to read a higher level than intended, or rather causing the threshold voltage necessary to read the left bit to be inflated such that this Vt is more indicative of a level 3 rather than the actual level 1 or level 2 of the left bit. Similarly, the charge on the left bit may cause the right bit to read a lower current than intended, or rather cause the threshold voltage necessary to read the right bit to be inflated such that this Vt is more indicative of a higher Vt level bit.

Figure 7:
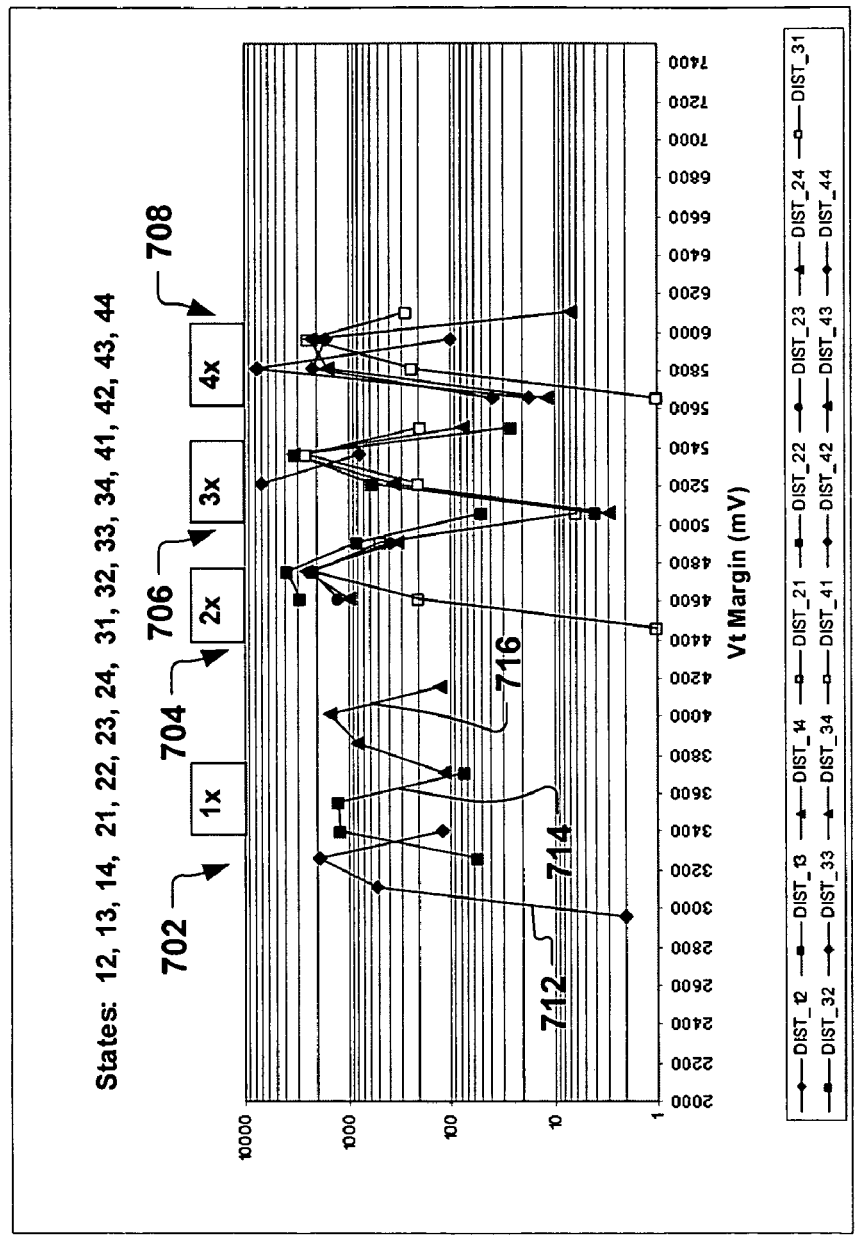
FIG. 7 is a graph illustrating threshold voltage distributions for an array of cells and the affect that dual bits can have on one another, particularly where the bits are stored at different levels.

FIG. 7 is a graph 700 that illustrates such a situation where dual bits within a cell can be programmed to four different levels, and where the charges on the cells can affect one another. A threshold voltage (Vt) margin for a first or left bit as measured in milli-volts (mV) is plotted on the x-axis, while the distribution or number of occurrences for particular Vt's is plotted on the y-axis on a logarithmic scale. The graph 700 includes four different exemplary groupings of curves 702, 704, 706, 708 corresponding to the four different levels to which the first or left bit can be programmed. Each of the groupings contains a plurality of curves that reveal the shift in Vt for the left bit as the level of the right bit is altered (e.g., increased).

For example, grouping 702 includes three curves 712, 714, 716 that correspond to program states of 1-2, 1-3 and 1-4, respectively, which may correspond to the left bit being blank and the right bit being programmed to three different states, for example. It can be seen that as the right bit is programmed harder, a range of values of Vt for the left bit (which remains at a (blank) level 1 in all of the curves 712, 714, 716 in grouping 702) increases. In curve 712, for example, where the first or left bit is programmed to a level 1 and the second or right bit is programmed to a level 2 (e.g., 1-2), the value of Vt for the left bit falls within a range of between about 3000 to about 3500 milli-volts blank Vt(blank threshold Vt). In curve 716, however, where the right bit is programmed to level 4 (e.g., 1-4), the range of Vt values for the left bit is shifted upwards and is higher than the original blank Vt. This shift in Vt for the left bit is a function of the change in threshold Vt (delta Vt=program Vt for level 4−blank Vt) of the right bit (which is programmed to level 4), or is equal to Vt blank+a function of program deltaVt level of right bit (which is level 4).

It can be appreciated that, while not as dramatic, similar shifts occur where the left bit is programmed to levels 2, 3, and 4 and the right bit cycles through programmed levels 1, 2, 3, and 4. This can be seen in groupings 704, 706 and 708, respectively. More importantly, it can be seen that such shifts may cause some ranges to overlap. For example, there may appear to be some slight overlap (e.g., some 2× distributions (704) overlapping 3× distribution Vt region (706)) between grouping 704 where the left bit is programmed to a level 2 and grouping 706 where the left bit is programmed to a level 3. Thus, a Vt shift in this population of level 3 bits may cause the left bit to be (mis)interpreted as a level 2 when it should be a level 3 or vice versa (e.g., a 2-2 (or 2×) instead of a 3-2 or 3-3 (or 3×) or vice versa).

Figure 8A:
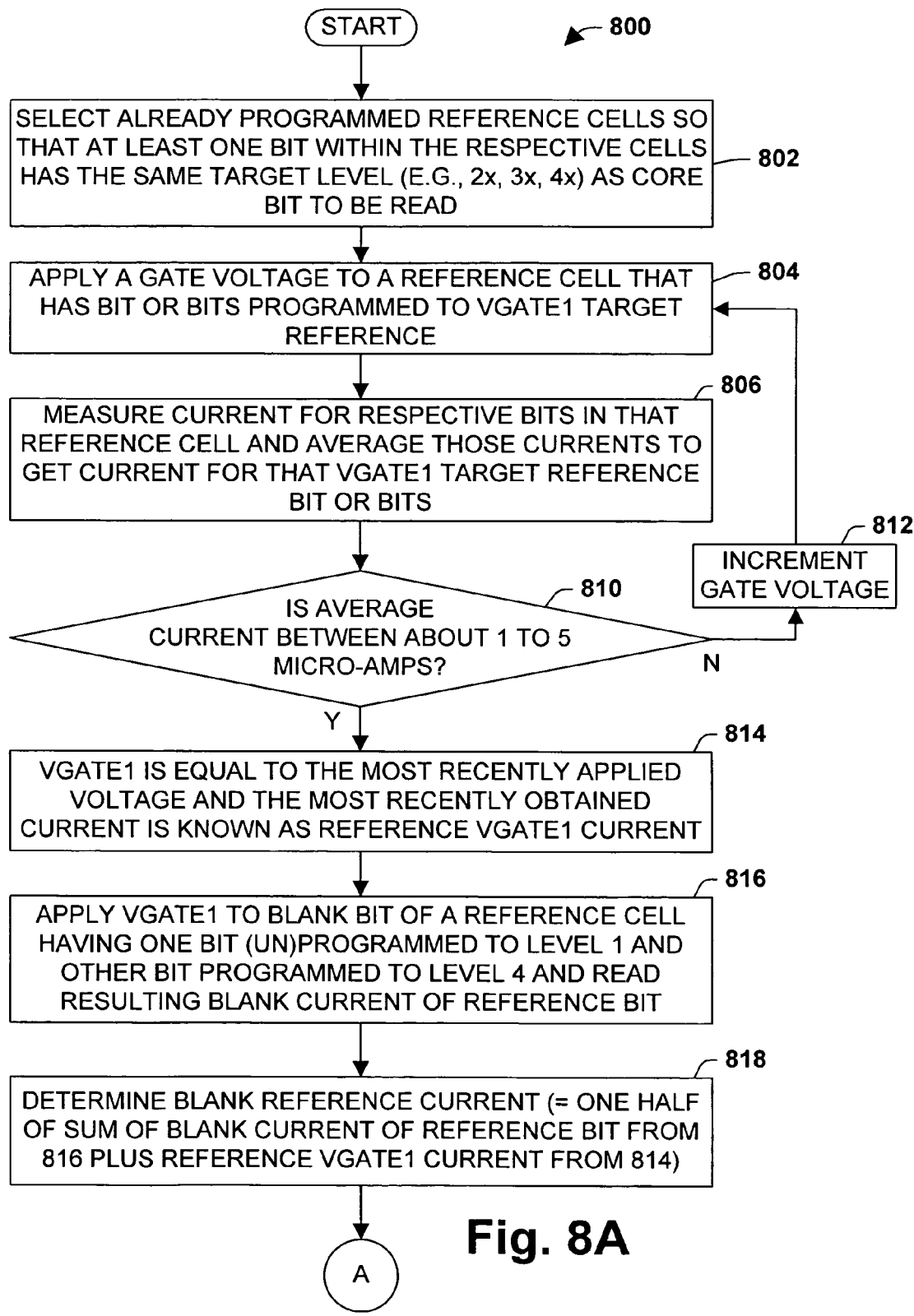
FIGS. 8A, 8B and 8C is a flow diagram illustrating an exemplary technique for reading the level of a bit in a dual sided ONO flash memory cell in accordance with one or more aspects of the present invention.
Figure 8B:
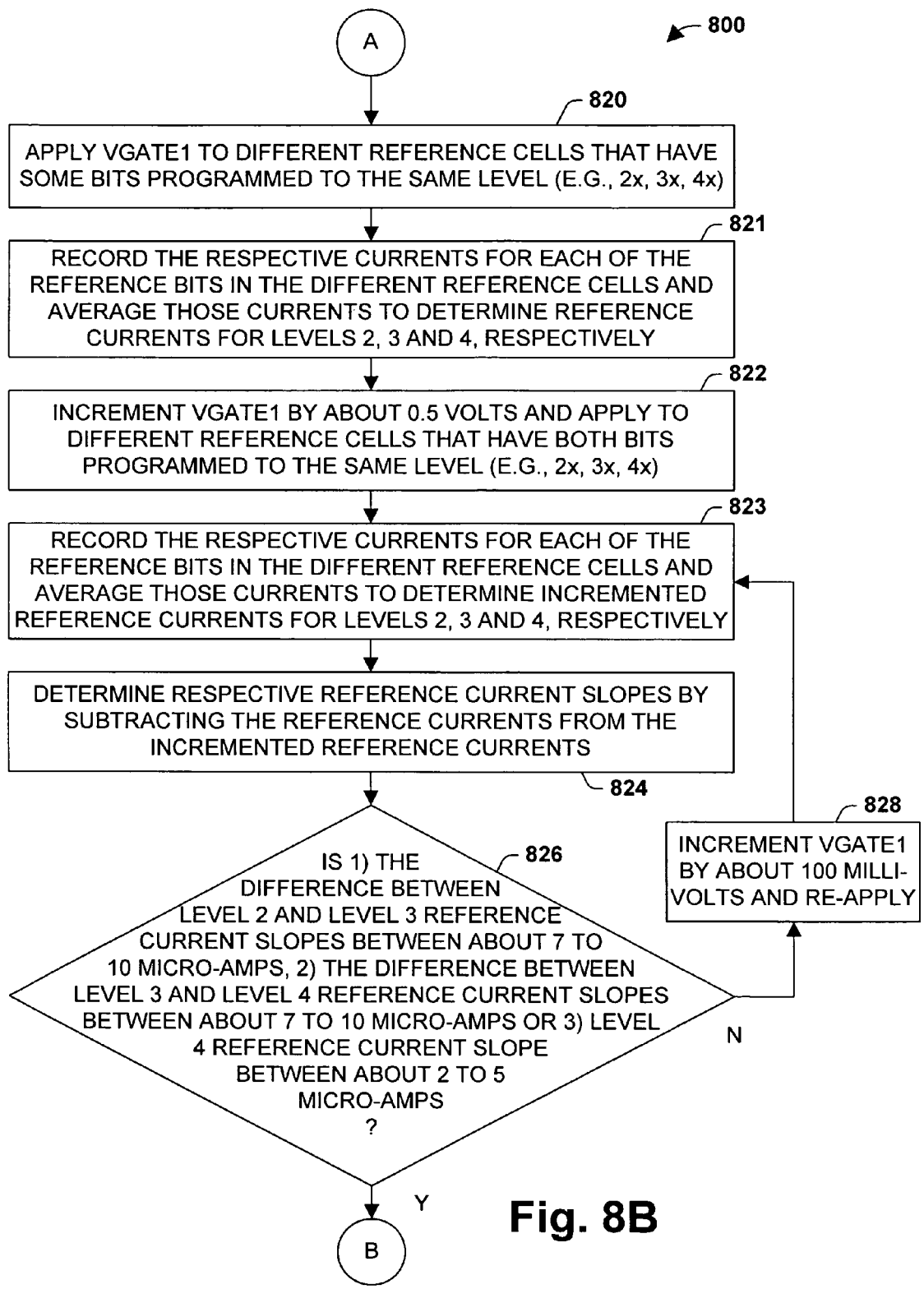
Figure 8C:
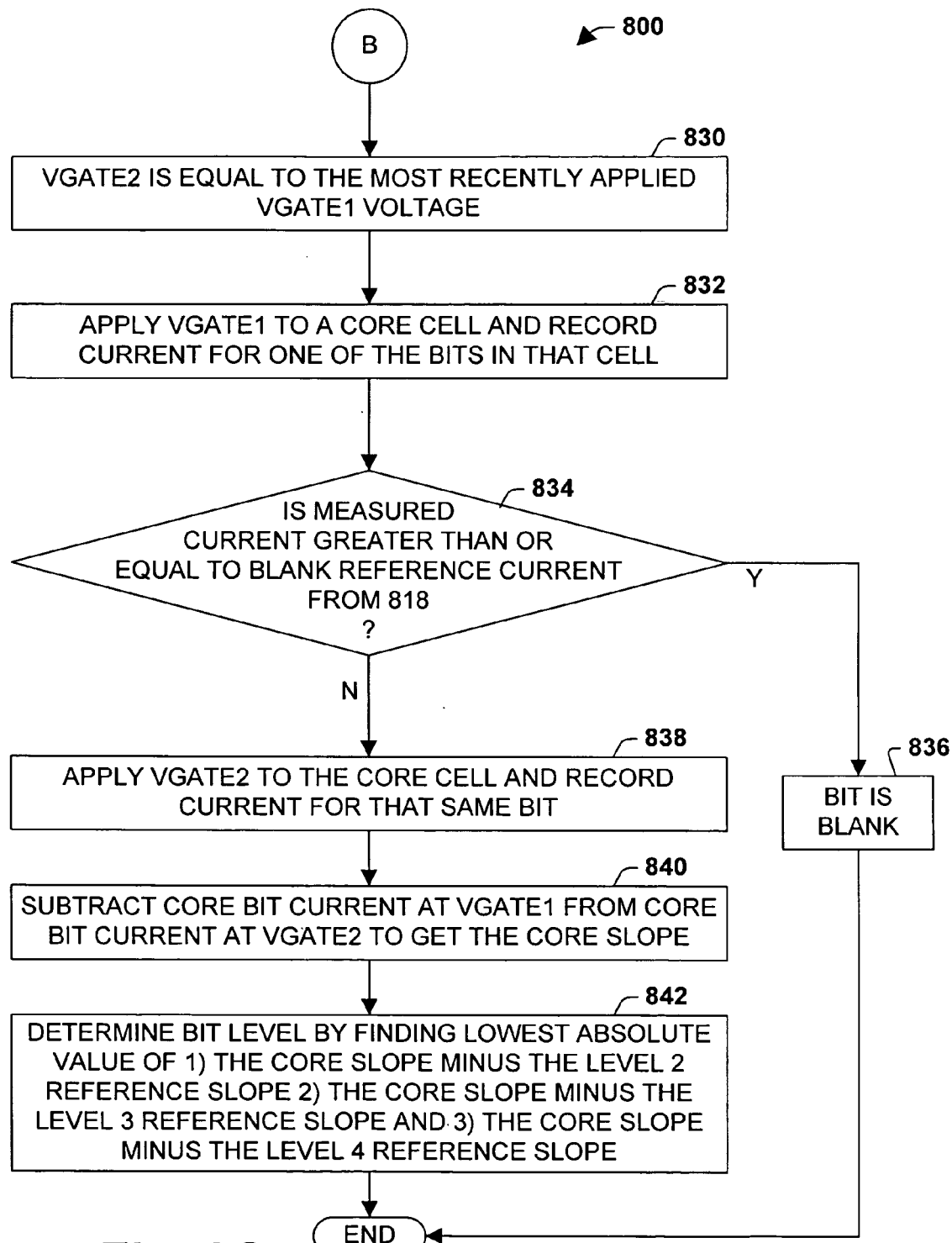

Thus, it can be appreciated that a technique would be desirable that allows the programmed level of bits of a dual sided ONO flash memory cell to be more accurately determined. Turning to FIGS. 8A, 8B and 8C, then, a methodology 800 is illustrated that facilitates determining the programmed level of a bit in a dual sided ONO flash memory cell. It will be appreciated that although the methodology 800 is illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

In the methodology, a metric known as transconductance (Gm) is referenced in determining the bit level. Transconductance is utilized because it provides a higher resolution for bit states than other metrics alone, such as drain current, gate voltage, etc. These Gm characterizations are ONO flash dependent and thus are related to the charge profile of the ONO flash. Existing comparison circuits do not work well because of small differences in threshold voltages (Vt's) and drain currents between bit states. By way of further example, drain currents and threshold gate voltages for a read operation may be very small (e.g., on the order of micro-amps and milli-volts, respectively) and may present difficulties in yielding an accurate indication of the amount of stored charge. For instance, uncertainty and/or margins of error may substantially impact on the accuracy of the measurements taken, making it difficult to perform reliable and insightful analyses on the data.

However, changes in drain current as a function of changes in applied gate voltage, which is the transconductance metric, yield a more refined range of data from which more accurate determinations can be made. More particularly, larger differences may exist between different transconductance values that correspond to different bit levels. This makes it easier to more accurately identify the state of a bit. Transconductance (Gm) is a ratio of a change in drain current to a change in gate voltage over a small interval on a drain current versus gate voltage curve, or Gm=$\Delta$Ids/$\Delta$Vgs. As the change in gate voltage becomes smaller and smaller, the value approaches a slope of a line that is tangent to the curve at a specific point. The slope of this line represents the theoretical transconductance for a given gate voltage and drain current.

At the outset, the methodology begins at 802 where a plurality of reference cells have been programmed such that at least one side within the respective dual bit cells are programmed to the same level as the core bit to be read (e.g., to a 2×, 3×, 4×). It is to be appreciated that 1-1 or 1× would generally not be utilized since such a cell is not really programmed, but rather has two un-programmed or blank bits. At 804, a gate voltage is applied to a reference cell that has bit(s) programmed to a vgate1 target reference (e.g., level 2). Then a current reading is taken for the respective bits at 806, and these currents are averaged (provided that the currents are from multiple reference bits programmed to the same level, such as a level 2, for example) to get a vgate1 target current. It will be appreciated that reading currents as referenced herein generally means reading drain to source currents (Ids).

At 810, a determination is made as to whether the vgate1 target reference current is between about 1 to 5 micro-amps. If it is not, then the applied gate voltage is incremented (e.g., by about 0.1 volts) at 812 and the methodology returns to 804 so that a new vgate1 target reference current can be ascertained. If the vgate1 target reference current is determined to be somewhere between about 1 to 5 micro-amps at 810, then the methodology advances to 814 where vgate1 is said to be equal to the voltage that was most recently applied at 804, and the most recently obtained current (e.g., that fell between about 1 to 5 micro-amps) is designated as reference vgate1 current. The methodology then proceeds to 816 wherein vgate1 is applied to the blank bit of a two bit reference cell that has one bit (un)programmed to a level 1 and the other bit programmed to a level 4, and the resulting blank current of the reference bit is read. At 818, a blank reference current is determined by taking one half of the sum of the reference vgate1 current from 814 and the blank current of the reference bit from 816. At this point, there exists a first "coordinate" or reference point for a transconductance determination.

At 820, vgate1 is applied to different reference cells that have some bits programmed to the same level as the core bit to be read. At 821, the currents are recorded for both bits and the respective currents are averaged to get a level 2 reference current, a level 3 reference current and a level 4 reference current. It will be appreciated that multiple two bit cells may be utilized to get these currents. For example, a plurality of 2× cells can be measured and all of their respective currents can be averaged to get the level 2 reference current. Similarly, a plurality of 3× and 4× cells can be utilized to get the level 3 and level 4 reference currents, respectively. At 822, vgate1 is incremented by about 0.5 volts and is applied to reference cells programmed as in 820. In fact, the reference cells used in 822 are the same ones used in 820. Currents are then read from the cells and averaged at 823 as in 821 to get incremented level 2, level 3 and level 4 reference currents for the incremented vgate1.

At 824, respective reference current slopes are determined by subtracting the vgate1 reference currents from 821 for levels 2, 3, and 4 from the incremented level 2, 3 and 4 reference currents from 823. For example, a level 2 reference current slope is determined by subtracting the level 2 reference current from 821 from the incremented level 2 reference current from 823. A determination is then made at 826 as to whether the difference between the level 2 and level 3 reference current slopes is between about 7 to 10 micro-amps, whether the difference between the level 3 and level 4 reference current slopes is between about 7 to 10 micro-amps or whether the level 4 reference current slope is between about 2 to 5 micro-amps. If none of these conditions are true, then the incremented vgate1 is further incremented by about 100 milli-volts at 828 and the methodology returns to 823 so that new reference current slopes can be determined.

At this point, respective transconductance reference values exist for the different bit levels 2, 3 and 4. These are the respective reference current slopes for the different levels that have been determined at 824 by comparing respective changes in drain current as a function of changes in applied voltage. In particular, the Gm values have been determined by obtaining the difference between respective reference currents and corresponding incremented reference currents (e.g., ΔIgs), where the reference currents were obtained at a first threshold voltage (vgate1) and the respective incremented reference currents were obtained at an incremented threshold voltage (incremented vgate1). The determination at 826 attempts to ensure that the respective transconductance reference values or ranges for the different levels are sufficiently separated so that the potential for overlap is mitigated. In this manner, the possibility that a bit will be mis-identified or mis-read becomes rather remote when the metric of transconductance is utilized to identify the bit level (e.g., at 842).

If any one or more of the conditions at 826 are true, then the methodology advances to 830 where vgate2 is said to be equal to the value of the most recently incremented vgate1 applied at 823. It will be appreciated that vgate2 can also be a predetermined constant value that affords sufficient separation between level 2, 3 and 4 reference currents so that the levels may be readily differentiated from one another. In such a situation, reference current slopes/transconductance values can be determined in a manner similar to before, such as by subtracting vgate1 reference current values for the different levels 2, 3 and 4 from vgate2 reference current values for the different levels 2, 3, and 4.

Then, at 832, to read the level of a particular bit in a core memory cell, vgate1 is applied to that cell and the resulting core current is recorded for that bit. At 834, a determination is made as to whether the measured core bit current is greater than or equal to the blank reference current obtained at 818. If so, then at 836, the bit is said to be at a level 1 or blank or un-programmed. If the determination at 834 is not true, then the methodology advances to 838 where vgate2 is applied to the cell and the current is read for the bit of interest. Then, at 840, the core bit current obtained at 832 (where vgate1 was applied to the cell) is subtracted from this vgate 2 current to ascertain the core current slope. In this manner, a transconductance value is obtained for the core bit at 840, namely a change in drain current as a function of a change in applied voltage. More particularly, this value is determined by finding the difference between a drain current obtained at 832 at vgate1 and a drain current obtained at 838 at vgate2.

The level of the bit of interest is then determined at 842 by finding the minimum absolute value of the level 2 reference current slope subtracted from the core current slope, the level 3 reference current slope subtracted from the core current slope and the level 4 reference current slope subtracted from the core current slope. The determination at 842 essentially compares the transconductance for the bit determined at 840 to the respective reference transconductance values determined at 824. The level of the core bit is thus determined by finding the closest reference value, or rather the reference value that yields the smallest difference between the transconductance value for the bit and the reference transconductance value.

Once the value of the bit has been determined, the process can end or be repeated for the other bit in the cell, as well as for bits in other cells. It will be appreciated, however, that only acts 832 through 842 may have to be repeated to determine the value of the virtual ground ONO flash or of other bits in other cells. This is particularly true for the virtual ground ONO flash since variations in cellular composition (that would have an affect on bit performance/charge storage) would likely be very minimal across the same cell. Moreover, the acts leading up to 843 generally pertain to obtaining reference data (e.g., reference transconductance values). Further, finding the reference currents and all the other acts leading upto 843 generally can be repeated for each wordline (e.g., one of 104 core array). Additionally, while the context of the discussion herein has been with regard to bits having four different levels, the present invention has application to any number of different levels. This is particularly true since the number of levels may be considered to be arbitrary and is merely based upon sufficiently detectable differences between amounts of stored charge, where the amount of charge stored generally increases rather gradually along a continuum.

Figure 9:
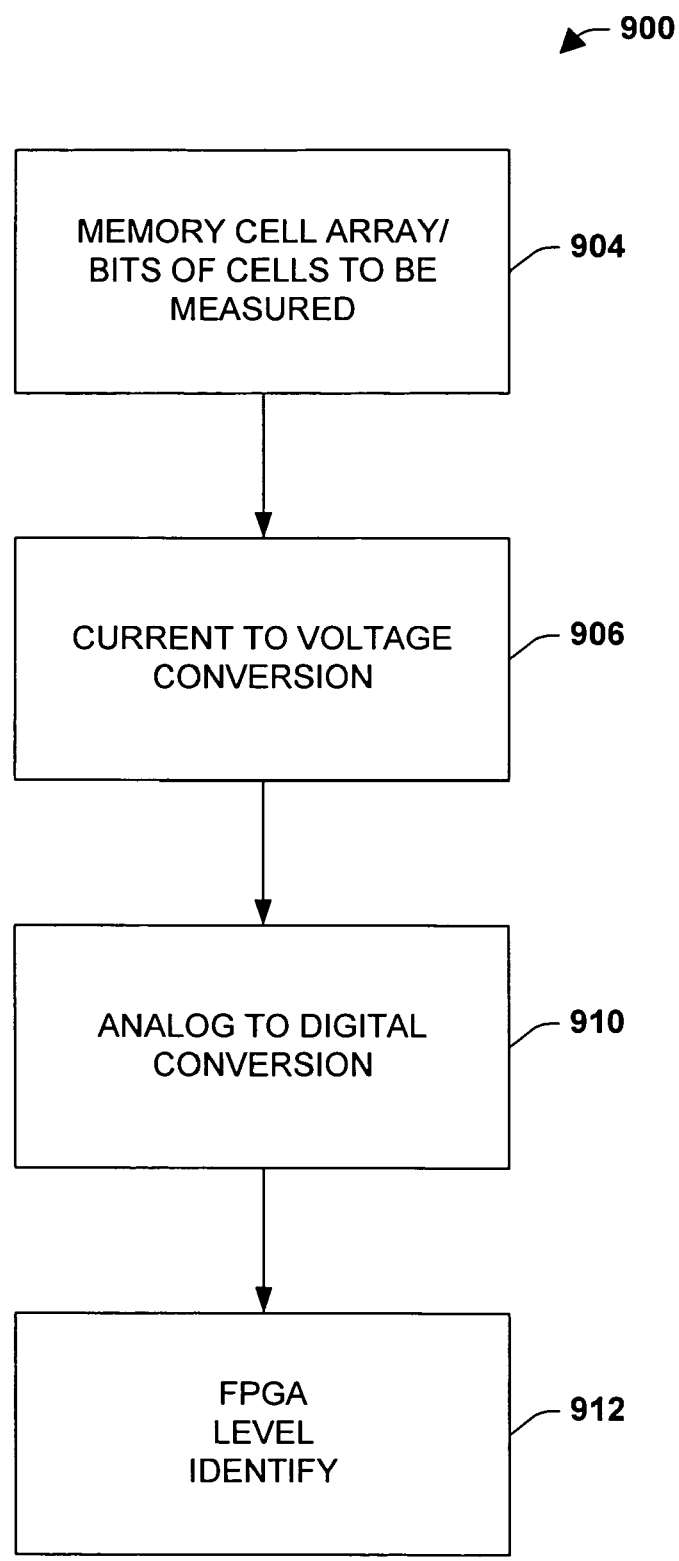
FIG. 9 is a schematic block diagram illustrating a system operative to implement a proposed algorithm in accordance with one or more aspects of the present invention.

Turning to FIGS. 9–15, a system or architecture is disclosed that is operative to implement the aforementioned algorithm in hardware in accordance with one or more aspects of the present invention. FIG. 9, for example, is a schematic block diagram that illustrates such a system 900 at a very high level. More particularly, FIG. 9 illustrates component parts of such a system 900 and describes briefly operations performed thereby. For example, an array of memory cells 904 is operatively coupled to a component 906 adapted to convert current read from one or more of the cells, and more particularly from bits in the one or more cells, to respective voltages. The voltages then go from the current to voltage conversion component 906 to a component 910 that converts the analog voltages to digital values. The digital voltages then advance to a field programmable gate array (FPGA) 912 where corresponding bit levels can be ascertained from the voltage values.

Figure 10:
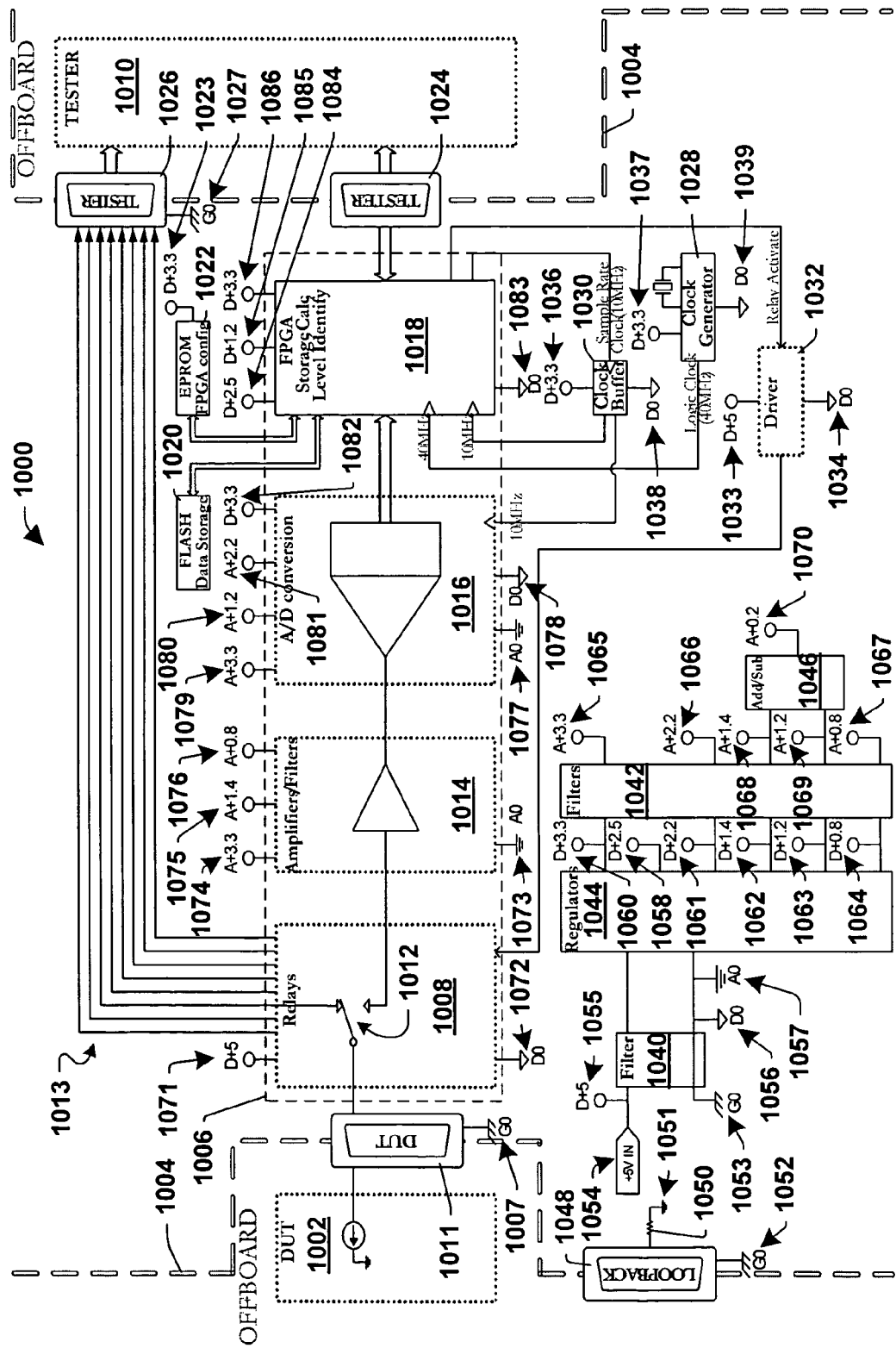
FIG. 10 is a functional block diagram illustrating a more detailed hardware implementation operative to execute a proposed algorithm according to one or more aspects of the present invention.

FIG. 10 is a functional block diagram showing the hardware implementation 1000 in somewhat greater detail. The memory array or device under test (DUT) 1002 containing the bits whose current is to be measured and whose program level is to be determined is located off of a circuit board containing the hardware implementation 1000. The perimeter of the board is, for example, represented by dashed lines 1004. In the example illustrated, a single channel 1006 is shown that can facilitate a bit level determination based upon a measurement of a drain current in the bit when a voltage is applied to the gate of a memory cell containing the bit. It will be appreciated that such current may be measured from buried bitlines serving as drain and source regions as described above. As will be appreciated in greater detail in view of further discussion, any suitable number of channels can be arranged in parallel to facilitate multiple bit level determinations concurrently.

One or more relays 1008 are included in the channel 1006 to provide for the selective connection of measured drain current to an off-board tester 1010 or to further downstream components within the channel 1006. The device under test may be coupled to the relay 1008 by a DUT interface 1011 which may be shielded to ground G0 1007, for example. The interface 1011 may link the DUT 1002 to the relay 1008 via a plurality of signal and ground wires (e.g., 8 signal and ground wires) where the ground wires run from the DUT to an analog ground A0 and there is a common shield cover to plus or minus 5V of a supply ground G0. In the illustrated example, a switch 1012 within the relay is in an open position or oriented so that the current advances to the tester 1010 rather than to the other components within the channel 1006. The example presented also shows 8 wires or other type of connectors 1013 running between the relay 1008 and the tester interface 1011. With the switch 1012 open, the example shows a third of the 8 wires connected to the tester 1010. It will be appreciated that such a tester is generally a rather large machine used in production that processes measurements in software. One or more aspects of the present invention facilitate this processing in an accelerated manner by the disclosed hardware implementation.

When the switch 1012 is closed, the measured current passes into a component 1014 containing one or more amplifiers and/or filters. This generally corresponds to component 906 in FIG. 9 and includes one or more transimpedance amplifiers that facilitate converting the current into a corresponding voltage value. After being converted to a voltage, the signal advances into an analog to digital (A/D) conversion component 1016, which generally corresponds to component 910 in FIG. 9. The analog to digital converter 1016 transforms the analog signal to a multibit value. For example, if component 1016 is a four bit A/D converter, the analog voltage value can be represented by any of 16 (e.g., $2^4$) different four bit digital numbers (e.g., 0000 to 1111). It will be appreciated that the relays 1008 merely serve a mechanism that allows the tester to be selectively bypassed and the DUT 1002 to be coupled to the channel 1006. Accordingly, the relays 1008 are optional and could be replaced by more permanent type of coupling between the DUT 1002 and the channel 1006.

The digital signal then advances to a field programmable gate array (FPGA) component 1018 that facilitates a determination of the level of the bit based upon the now manipulated drain current. The FPGA generally has storage and calculation capabilities, but is also operatively coupled to flash data storage 1020 as well as EPROM 1022 for configuring the FPGA, among other things. In the illustrated example the EPROM is biased to plus 3.3 above a reference value D 1023. The FPGA 1018 may also be coupled to the off board tester 1010 through a tester interface 1024 to send and receive, among other things, data and commands and a communication clock signal of a frequency of about 2 mega-hertz, for example. Results from the FPGA may be communicated to the tester for further processing, for example. It will be appreciated that the measured currents passing through the relay 1008 may similarly be coupled to the tester 1010 through a tester interface 1026 which may be shielded to ground G0 1027. The interface 1026 may link to the tester 1010 via a plurality of signal and ground wires (e.g., 8 signal and ground wires) where the ground wires run from the analog ground A0 to one or more tester grounds and there is a common shield cover to plus or minus 5V of a supply ground G0.

A clock generator 1028, a clock buffer 1030 and a driver 1032 are also included to facilitate, among other things, reading data into the system, toggling the switch 1012, causing the A/D conversion to take place and the FPGA 1018 to activate to identify the bit level, for example. In particular, a relay activate signal initiated by the FPGA 1018 is sent via the driver 1032 to the relay 1008 to cause the switch 1012 to close and couple the DUT 1002 to the channel 1006. The driver 1032 may be biased to D plus 5 1033 as well as to a common level D0 1034. Similarly, a sample rate clock signal originating from the FPGA 1018 is sent to the clock buffer 1030 and is forwarded to the A/D converter 1016 and back to the FPGA 1018 from the clock buffer 1030. Such a signal may operate at a frequency of about 10 mega hertz, for example. Likewise, a logic clock signal operated at a frequency of about 40 mega hertz, for example, is provided by the clock generator 1028 to the FPGA 1018. Additionally, the clock buffer 1030 and the clock generator 1028 may respectively be biased to D plus 3.3 1036, 1037 as well as to common level D0 1038, 1039.

First 1040 and second 1042 filter components, a regulator component 1044, an add/subtract component 1046 and a loopback component 1048 are also included to facilitate calibrating one or more channels, establishing respective current ranges and minimum (e.g., zero) and maximum current values for the system and accounting for offset, if any, among other things. A plurality of resistors 1050 (e.g., 8 resistors—not all shown) may be coupled to the loopback component 1048 and tied to ground 1051 to facilitate gain calibration, for example. Such resistors may be about 14 kilo ohm resistors, for example, and an external cable can be utilized to short the loopback component 1048 and one or more of the interfaces, such as tester interface 1026. The loopback component 1048 and the first filter component 1040 may be coupled to supply ground G0 1052, 1053, respectively.

A plus 5V input 1054 may also be coupled to the first filter component 1040 as may be a bias of D plus 5 1055. Similarly, the first filter component 1040 may also have a coupling to a common ground D0 1056 while the regulator component 1044 has a coupling to an analog ground A0 1057 where the common ground D0 1056 and the analog ground A0 1057 are themselves operatively coupled. Further, the regulator component 1044 may be coupled to a bias of D plus 2.5 1058 and the regulator component 1044 along with the second filter component 1042 may have couplings to biases of D plus 3.3 1060, D plus 2.2 1061, D plus 1.4 1062, D plus 1.2 1063 and D plus 0.8 1064. Similarly, the second filter component 1042 may be biased to A plus 3.3 1065, A plus 2.2 1066 and A plus 0.8 1067 while the second filter component 1042 in conjunction with the add/subtract component 1046 can be coupled to a bias of A plus 1.4 1068 and A plus 1.2 1069. Finally, the add/subtract component 1046 may itself coupled to a bias of A plus 0.2 1070.

Other components within the system may similarly be coupled one or more biases to facilitate desired operation. For example, the relay 1008 may be biased to D plus 5 1071 as well as to common level D0 1072. The amplifier/filter component 1014 may be coupled to analog ground A0 1073 as well as A plus 3.3 1074, A plus 1.4 1075 and A plus 0.8 1076. The A/D converter 1016 may be coupled to analog ground A0 1077 and common ground D0 1078 as well as A plus 3.3 1079, A plus 1.2 1080 and A plus 2.2 1081 and D plus 3.3. 1082. Likewise, the FPGA 1018 may be coupled to common ground 1083 and D plus 2.5 1084, D plus 1.2 1085 and D plus 3.3 1086.

Figure 11:
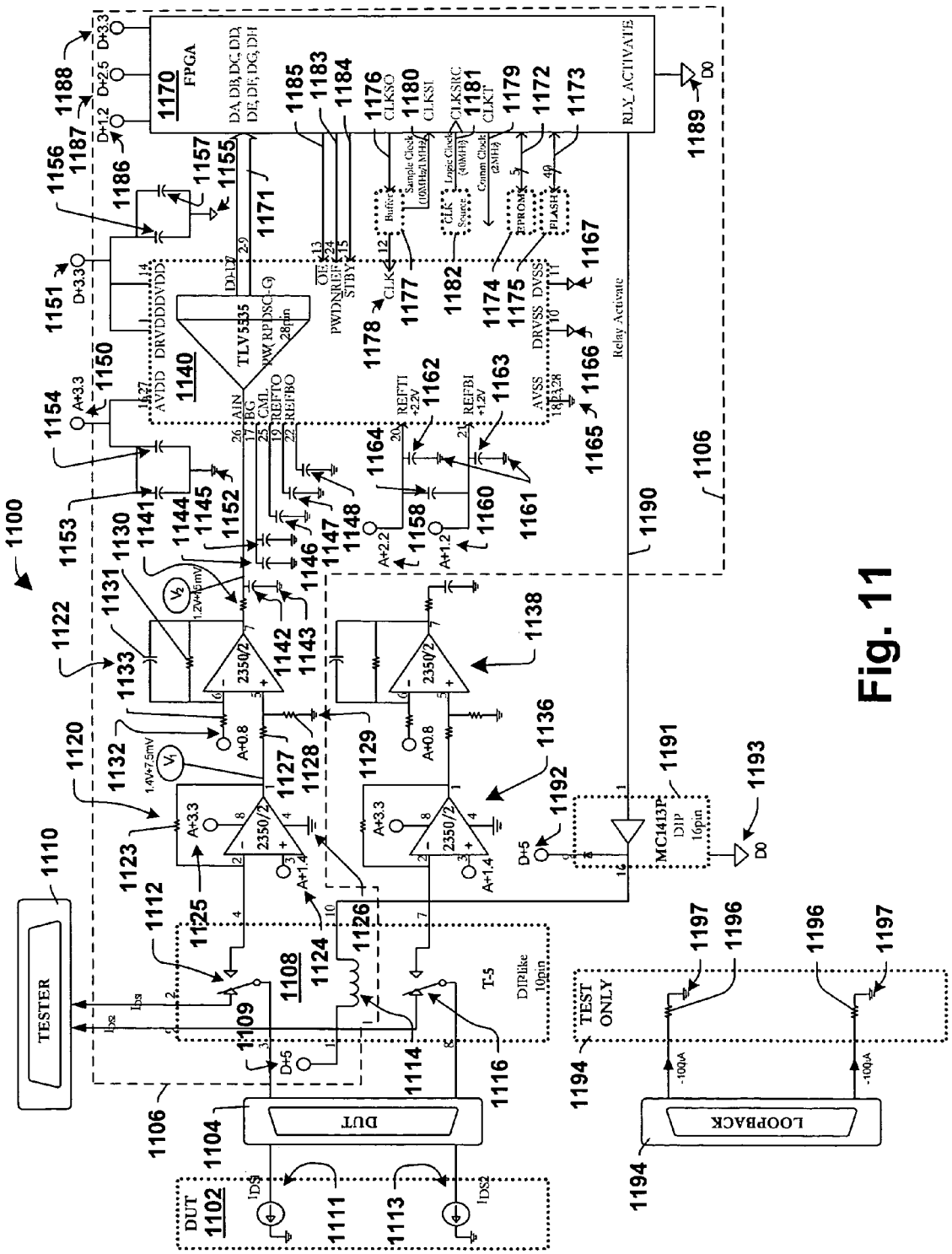
FIG. 11 is a circuit diagram illustrating an exemplary hardware implementation in accordance with one or more aspects of the present invention.

Turning to FIG. 11, a circuit diagram illustrates an exemplary hardware implementation 1100 in accordance with one or more aspects of the present invention. The memory array or device under test (DUT) 1102 is coupled via a DUT interface 1104 to a channel 1106 adapted to facilitate a determination of a programmed level of a bit. In the example illustrated, a single channel 1006 is shown that can facilitate a bit level determination based upon a measurement of a drain current in the bit when a voltage is applied to the gate of a memory cell containing the bit. It will be appreciated that such current may be measured from buried bitlines serving as drain and source regions as described above.

A relay 1108 is included in the channel 1106 to facilitate selectively coupling current from the DUT 1102 to downstream components of the channel 1106 or to an external tester (not shown) via a tester interface 1110. Such a relay 1108 may include a switch 1112 and an inductive coil 1114, for example, that facilitates opening and closing the switch 1112. More particularly, when the coil is energized or rather a current is caused to flow there-through, an electromagnetic field developed there-around causes the switch 1112 to flip or toggle. In the illustrated example, the coil 1114 is also coupled to a bias of D plus 5 1109. It will be appreciated that while a single channel 1106 is depicted in the illustrated example, any suitable number of channels can be included to facilitate concurrent bit level determinations. For example, first 1111 and second 1113 currents corresponding to two respective bits are depicted in the illustrated example. Accordingly, a second switch 1116 is included for selectively coupling the second current 1113 to a corresponding second channel (not shown). It will be appreciated that the relay 1108 may be formed out of a 10 pin T5 dual in line package (DIP), for example. In the example presented, both switches 1112, 1116 are open such that the currents 1111, 1113 are routed to the tester rather than to respective channels.

Downstream of switch 1112 is a transimpedance amplifier 1120 followed by a differential amplifier 1122. These two components generally correspond to the amplifier/filter component 1014 in FIG. 10. The transimpedance amplifier 1120 includes a feedback resistor 1123 that may be on the order of about 5 kilo ohms, for example. Additionally, this amplifier 1120 may be formed out of, at least a portion of, an 8 pin OPA 2350 DIP. When switch 1112 is closed, the current 1111 flows into a negative or inverting input of the amplifier as does the feedback through resistor 1123. A bias of A plus 1.4 1124 is applied to a positive or non-inverting input of the amplifier. Additionally, biases of A plus 3.3 1125 and ground 1126 are similarly coupled to the amplifier 1120. Amplifier 1120 facilitates converting current 1111 into a voltage that can then be converted into a digital signal.

The output from amplifier 1120 is directed into a resistor 1127 coupled to a positive or non-inverting input of the differential amplifier 1122. The non-inverting input of the amplifier 1122 is also coupled to another resistor 1128 that is coupled to ground 1129. A feedback resistor 1130 and capacitor 1131 are included in amplifier 1122 and feed back to a negative or inverting input of the amplifier. A bias of A plus 0.8 1132 is also coupled to the negative input of the amplifier 1122 through a resistor 1133, which may be about 1 kilo ohm, for example. Similarly, resistors 1127, 1128 and 1130 may be on the order of about 1 kilo ohm, 2 kilo ohms and 2 kilo ohms, respectively, whereas capacitor 1131 may be on the order of about 100 pico farads, for example. Additionally, amplifier 1122 may be formed out of, at least a portion of, an 8 pin OPA 2350 DIP. For example, amplifiers 1120 and 1122 may each be formed out of about one half of an 8 pin OPA 2350 DIP. In the illustrated example, similar transimpedance and differential amplifiers 1136, 1138 are included for current 1113. However, the remainder of a channel for this current is not illustrated and a further discussion of these amplifiers 1136, 1138 is not included for purposes of simplicity and brevity.

The output of amplifier 1122 is directed to an A/D converter 1140 through a resistor 1141 and a capacitor 1142 coupled to ground 1143, where the resistor 1141 may be about 100 ohms and the capacitor 1142 may be about 5 nano farads, for example. A plurality of capacitors 1144, 1145, 1146, 1147, 1148 each having a capacitance of about 0.1 micro farad are also coupled to the A/D converter and ground for signal integrity and noise reduction. To facilitate Vcc coupling and mitigate propagation of noise into a power supply, for example, bias voltages and additional capacitors are also coupled to the A/D converter 1140. In the illustrated example, respective biases of A plus 3.3 1150 and D plus 3.3 1151 are operatively coupled to the converter 1140. Bias 1150 is also coupled to ground 1152 through parallel capacitors 1153, 1154, where the capacitors may, for example, be about 2.2 nano farads and about 100 nano farads, respectively. Similarly, bias 1151 is coupled to common ground 1155 through parallel capacitors 1156, 1157, where the capacitors may, for example, be about 100 nano farads and about 2.2 nano farads, respectively. Further, biases of A plus 2.2 1158 and A plus 1.2 1160 are coupled to A/D converter 1140, to ground 1161 and to one another through capacitors 1162, 1163, 1164, where the capacitors 1162, 1163, 1164 may all be about 0.1 micro farads, for example. The A/D converter is also coupled to ground 1165 and common ground 1166, 1167. Also, the A/D converter may be a TLV5535 type converter, for example. It will be appreciated that respective A/D converters would be included for different channels 1106 to facilitate concurrent processing.

The A/D converter 1140 is operatively coupled to a digital signal processing (DSP) circuit operative to implement the previously discussed algorithm. In the illustrated example, the DSP is implemented as a field programmable gate array (FPGA) 1170. The A/D converter 1140 thus feeds digital signals 1171 to the FPGA representative of the voltages produced from the amplifiers 1120, 1122. Similarly, the FPGA 1170 may also send and receive signals 1172, 1173 to and from EPROM 1174 and flash memory 1175, respectively. Likewise, FPGA 1170 outputs a plurality of signals, such as a clock signal 1176 to a buffer 1177 and on to a clock region 1178 of the A/D converter 1140, as well as a communication clock signal 1179 (e.g., at a frequency of about 2 mega hertz). The FPGA 1170 also receives a clock signal 1180 back from the buffer 1177 (e.g., at a frequency of between about 1 mega hertz to about 10 mega hertz). The FPGA 1170 further receives a clock signal 1181 from a clock source 1182 (e.g., at a frequency of about 40 mega hertz). The FPGA 1170 also outputs power down 1183, standby 1184 and other signals 1185 to the A/D converter 1140. In the illustrated example, respective biases of D plus 1.2 1186, D plus 2.5 1187 and D plus 3.3 1188 are applied to the FPGA 1170 and the FPGA is coupled to common ground 1189. It will be appreciated that the FPGA 1170 may be capable of servicing one or more channels concurrently. Additionally, the FPGA may be coupled to an external tester (not shown) for further data processing.

A relay activate signal 1190 is sent from the FPGA 1170 to a driver or buffer 1191 to facilitate driving the coil 1114 and selectively activating the switches 1112, 1116. The buffer 1191 may be a 16 pin MC1413P type dual in line package (DIP), for example. It will be appreciated that while one buffer is illustrated any number of buffers may be included. For example, one buffer may be included per channel. Similarly, rather than one coil controlling two switches, each switch may have an associated coil that is controlled by a respective buffer. In the example illustrated, a bias of D plus 5 1192 is applied to the buffer 1191 and the buffer is also coupled to common ground D0 1193. A test only component 1194 is also included for calibrating the channels to find out what range of currents to expect (e.g., zero to some maximum) and whether there is some offset. These values will be stored and subsequently accounted for in digital processing. The test only component 1194 is coupled to a loopback component or interface 1195 and includes, for example, a plurality of resistors 1196, such as about 14 kilo ohm resistors, for example, coupled to ground 1197.

As mentioned above, the transimpedance amplifier 1120 is operative to convert current from the DUT to a voltage which can then be converted into a digital signal by the A/D converter 1140. The second amplifier 1122 is, however, a differential amplifier that is operative to subtract some DC voltage that has been supplied to the cell. In particular, the cell whose bit level is being determined requires a DC voltage to be applied thereto to produce the drain current 1111 there-from. In the illustrated example, this is 1.4 volts DC. Thus, the voltage at amplifier 1120 is elevated from ground to 1.4 volts while the current is read from the cell. If this 1.4 DC voltage is not removed, it will be added to everything that is amplified and itself be amplified by the second amplifier 1122. Accordingly, in the example illustrated 0.8 volts are applied to the second amplifier in order to receive the correct range of values that satisfies the input for the A/D converter 1140.

By way of example, A/D converters are designed to receive and convert voltages between some minimum and maximum values, which happen to be between about 1.2 to about 2.2 volts in the illustrated example (e.g., between biases 1160 and 1158). The lower value of 1.2 volts, for example, is the lowest voltage value that the A/D converter will operate on and the upper value of 2.2 volts is the highest voltage value that the A/D converter 1140 will operate on. If, for example, the input current 1111 ranges from zero to 100 micro amps, then these currents need to be translated into the acceptable range of between 1.2 volts to 2.2 volts. Applying the 0.8 volts to the second amplifier 1122 facilitates this conversion. By way of further example, if the current 1111 has values of 0 micro amps, 1 micro amps, 10 micro amps and 100 micro amps, then the voltage V1 at the output of the first amplifier 1120 would be 1.4 volts, 1.4+0.005 volts, 1.4+0.05 volts and 1.4+0.5 volts respectively, while the voltage V2 at the output of the second 1122 amplifier would be 1.2 volts (e.g., (1.4−0.8)*2), 1.2+0.01 volts, 1.2+0.1 volts and 1.2+1 volts, respectively.

In addition, it will be appreciated that A/D converters can be designed to have converted output signals that are different numbers of bits. For example, an 8 bit A/D converter will have output signals that are 8 bits in length, whereas a 10 bit A/D converter will have output signals that are 10 bits in length. It will be appreciated that increasing the number of bits increases the resolution. For example, since each bit can be two different states (e.g., 0 or 1), the with just 2 bits the range can be broken down into 4 discreet values (e.g., as represented by 00, 01, 10, 11), whereas with an 8 bit the number a converted analog signal can be broken down into any of $2^8$ different discreet values (e.g., anywhere in between 00000000 and 11111111). In the illustrated example, the A/D converter 1140 is an 8 bit converter, hence the 8 bit signal 1171 sent from the converter 1140 to the FPGA 1170 (e.g., D0–D7). Thus, the minimum input of 1.2 volts would be converted into 00000000 and the maximum input of 2.2. volts would be converted into 11111111. Similarly, if 8 channels are run in parallel or concurrently, the FPGA would receive 64 bits, 8 bits per channel, for example, where the 8 bit word for each channel represents the current magnitude that has been sensed in the cell during the read. It is to be appreciated that specific values presented herein, such as bias values, etc. are exemplary in nature and are not meant to be interpreted in a limiting manner.

Figure 12:
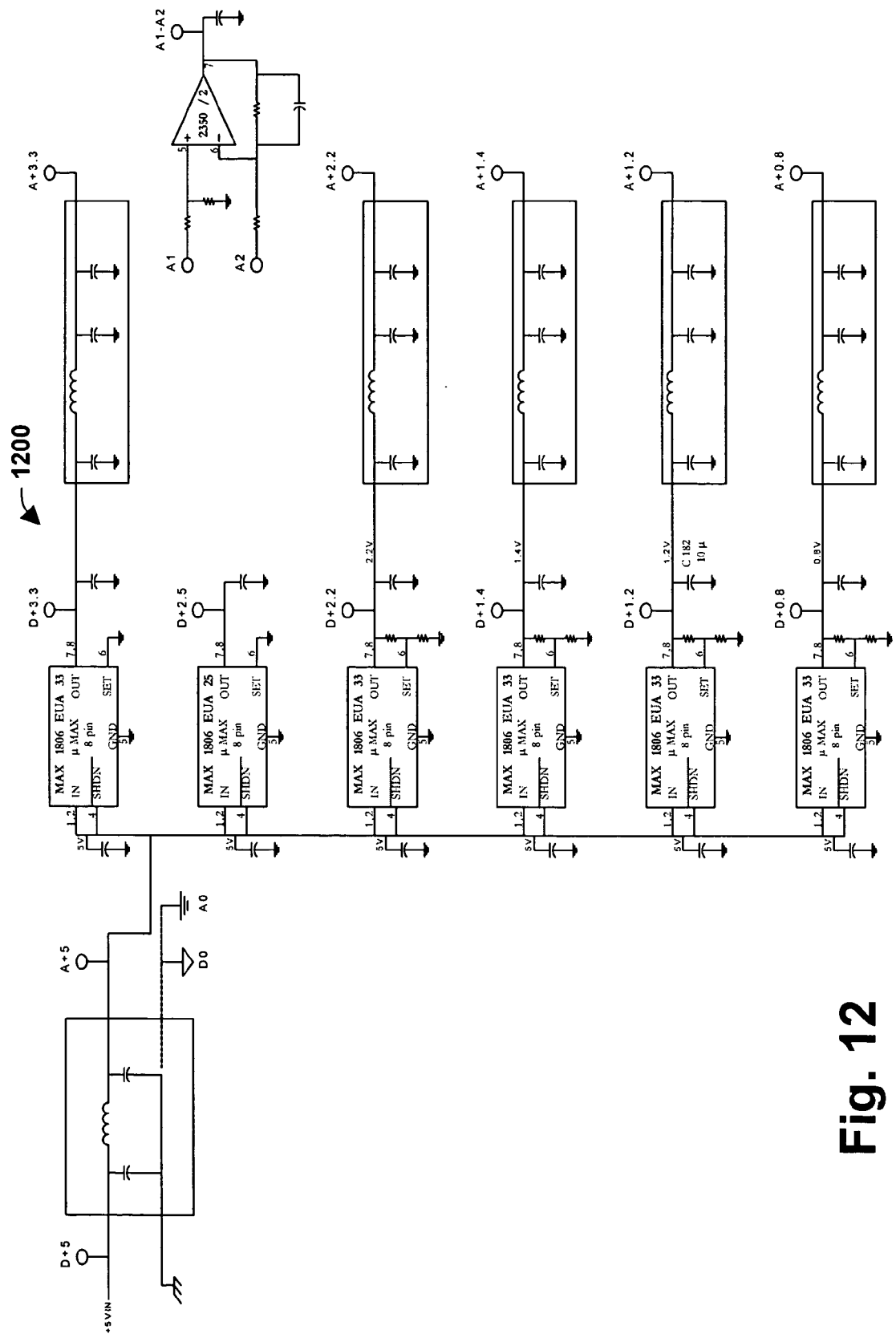
FIG. 12 is a circuit diagram illustrating exemplary supply circuitry suitable for use in an architecture adapted to implement a proposed algorithm according to one or more aspects of the present invention.
Figure 13:
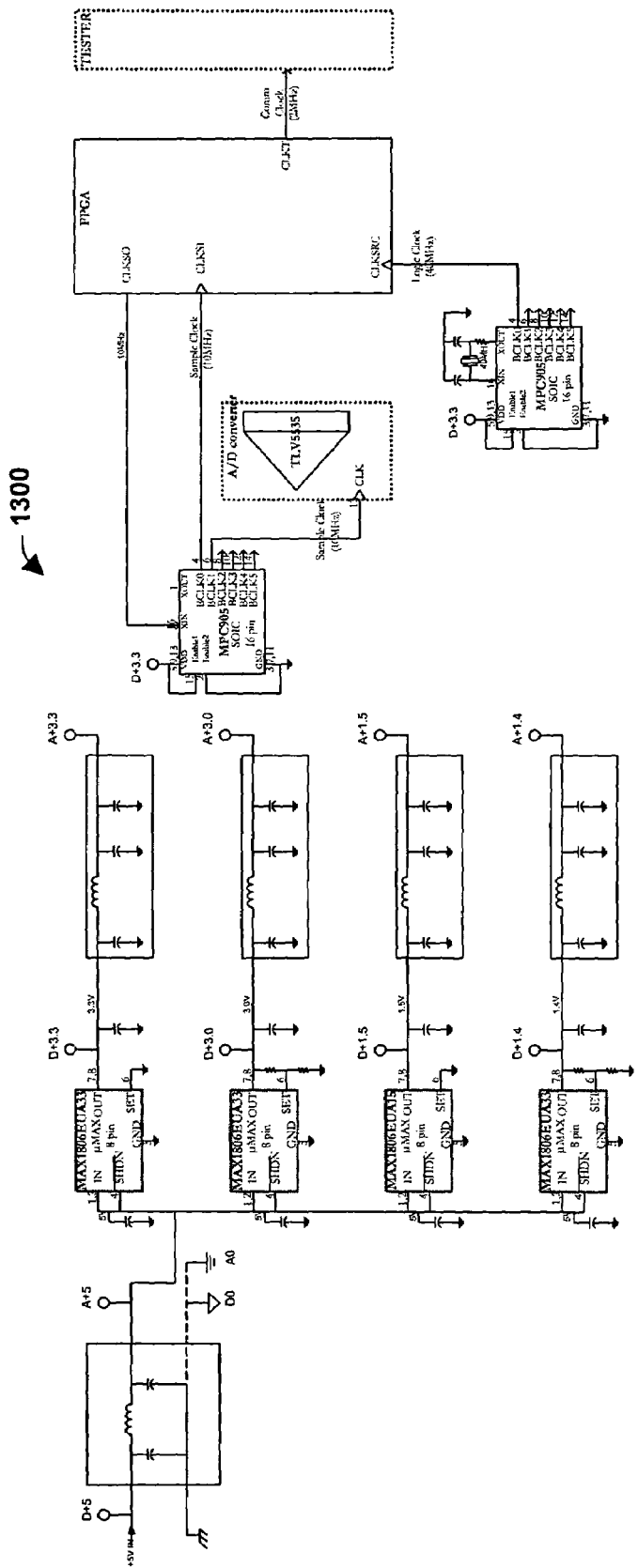
FIG. 13 is a circuit diagram illustrating exemplary clock circuitry suitable for use in an architecture adapted to implement a proposed algorithm according to one or more aspects of the present invention.

FIG. 12 is a circuit diagram illustrating exemplary supply circuitry 1200 suitable for use in a system adapted to implement the aforementioned methodology according to one or more aspects of the present invention. More particularly, FIG. 12 merely presents voltage regulators that are adapted to supply the different voltage values required by the rest of the components. In one example, they all feed from +5V which is supplied by the tester or an external power supply. Similarly, FIG. 13 is a circuit diagram illustrating exemplary clock circuitry 1300 suitable for use in a system adapted to implement the aforementioned methodology according to one or more aspects of the present invention. FIG. 13, for example, is a more detailed circuit diagram of the clocking circuitry described above with respect to FIG. 10.

Figure 14:
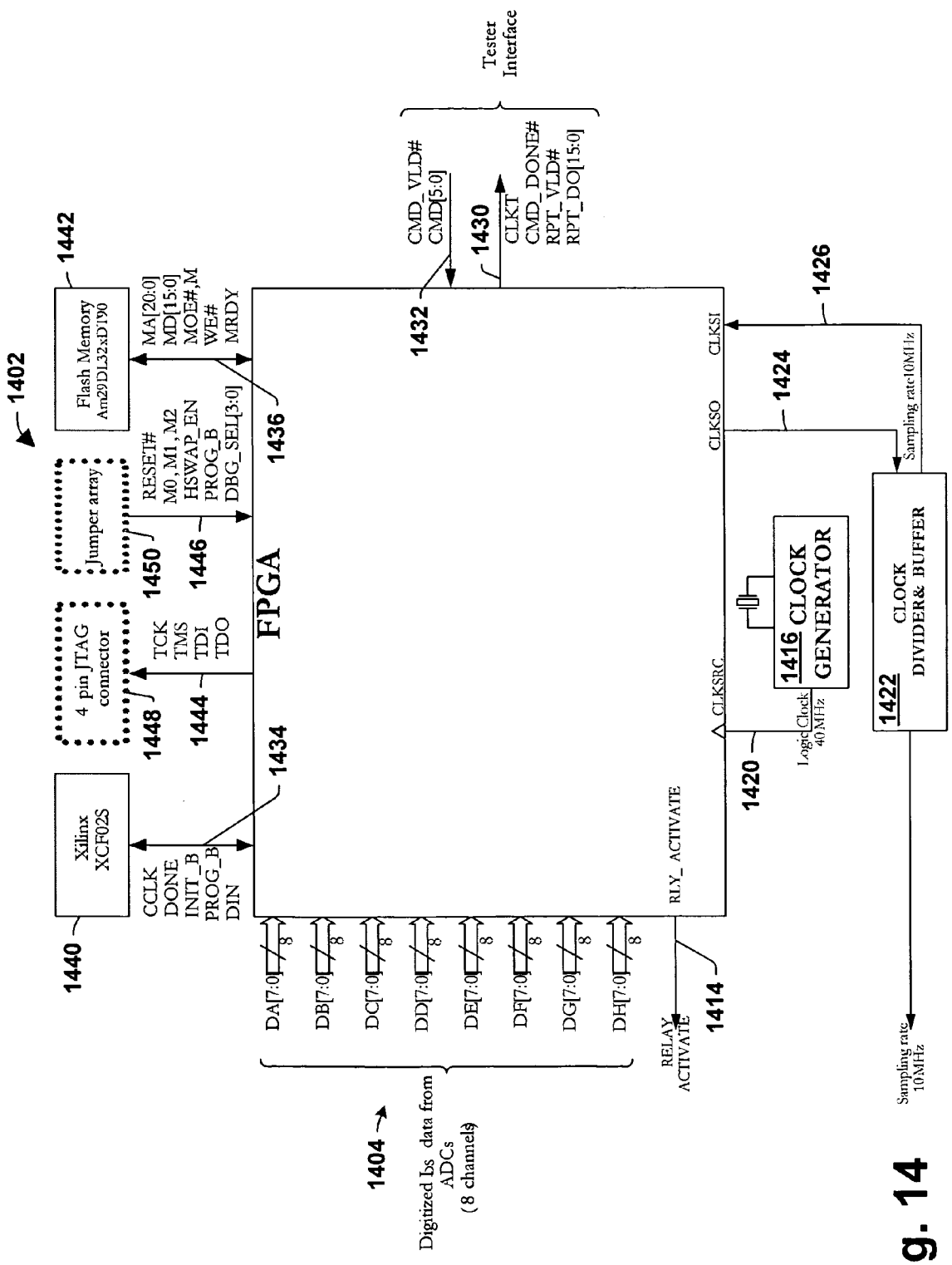
FIG. 14 is a circuit diagram illustrating an exemplary field programmable gate array (FPGA) suitable for use in an architecture adapted to implement a proposed algorithm according to one or more aspects of the present invention.

FIG. 14 is a circuit diagram illustrating an exemplary FPGA 1402 suitable for use in a system adapted to implement the aforementioned methodology according to one or more aspects of the present invention. A plurality of signals that are transmitted to and received from the FPGA are also depicted in FIG. 14. In particular, eight different 8 bit signals 1404 originating from eight different channels, namely DA–DH, are directed into the FPGA 1402. A relay activate 1414 signal is shown emanating from the FPGA 1402 to facilitate energizing a coil and activating one or more switches so that one or more test currents are directed into one or more respective channels. A clock generator 1416 is operatively coupled to the FPGA so as to deliver a clock signal 1420 to the FPGA (e.g., at a frequency of 40 mega hertz). Similarly, a combined clock divider and buffer 1422 is operatively coupled to the FPGA so as to receive a first clock signal 1424 and send and receive a second clock signal 1426 (e.g., at a frequency of 10 mega hertz). Likewise, a coupling to an external tester is depicted such that first 1430 and second 1432 signals can respectively be sent to and received from the tester. Also, signals 1434, 1436 are both transmitted to and from EPROM 1440 (e.g., Xilinx XCF02S type EPROM) and flash memory 1442, respectively. Finally, signals 1444, 1446 are respectively transmitted to a 4 pin JTAG connector 1448 and received from a jumper array 1450.

Figure 15:
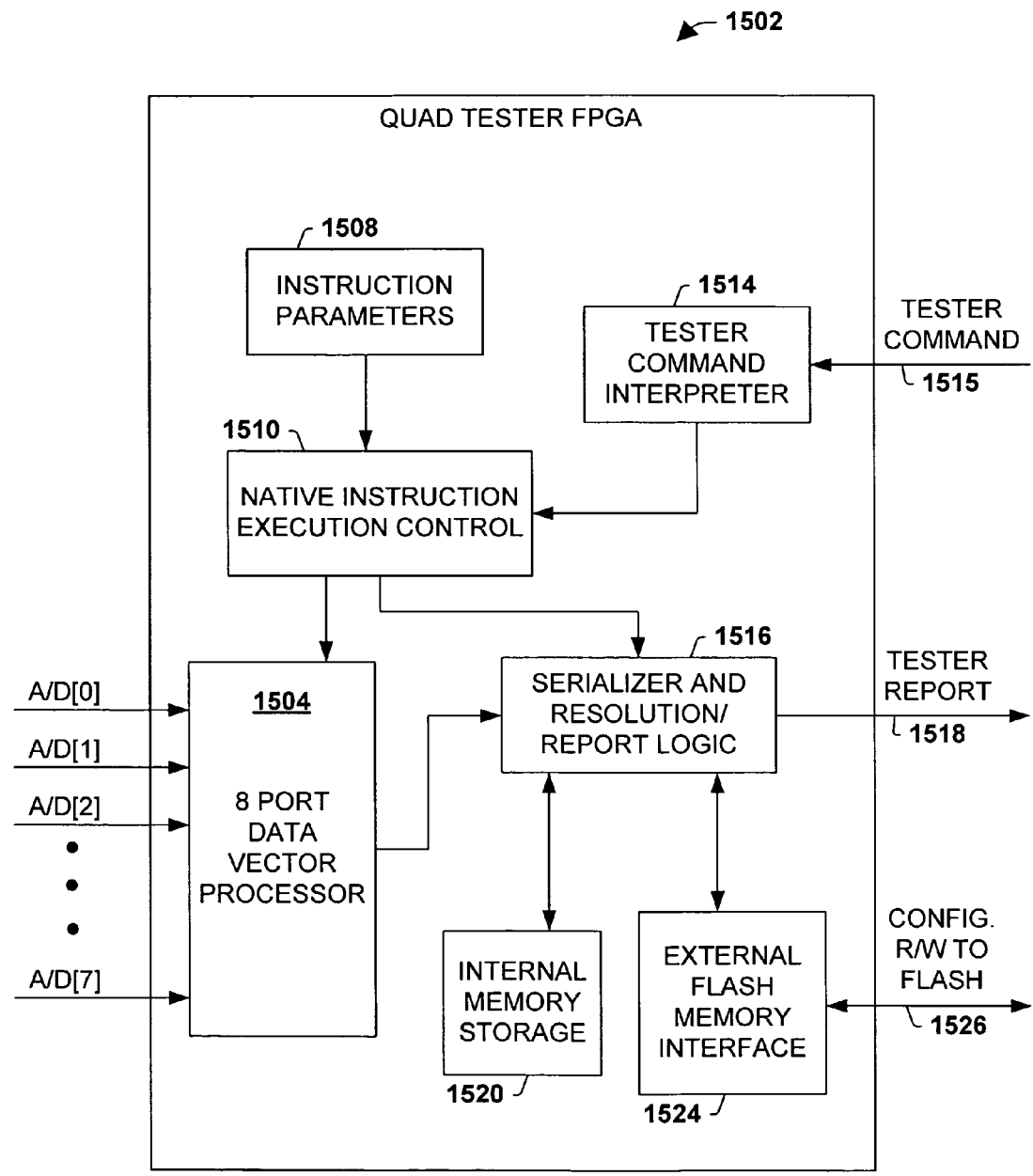
FIG. 15 is a functional block diagram illustrating an exemplary FPGA suitable for use in an architecture adapted to implement a proposed algorithm according to one or more aspects of the present invention.

FIG. 15 is a functional block diagram illustrating an exemplary FPGA 1502 suitable for use in a system adapted to implement the aforementioned methodology according to one or more aspects of the present invention. The FPGA 1502 may be a micro sequenced array data processor that may be adapted to implement the foregoing algorithm, for example. An 8 port data vector processor 1504 allows 8 strings of data (e.g., from 8 different channels) to be entered into the FPGA. It will be appreciated, however, that while the example of 8 is presented, the FPGA 1502 can be adapted to accommodate any suitable number of strings of data of any length. Instructions parameters 1508 are fed into a native instruction execution control 1510. A tester command interpreter 1514 receives a tester command signal 1515 from an external tester and is operative to forward a signal indicative of the same to the native instruction execution control 1510. More particularly, the tester command interpreter 1514 is adapted to translate respective commands from the external tester into corresponding sequences of micro-instructions. The vector processor 1504 and the execution control 1510 are operatively coupled to a serializer and resolution/report logic portion 1516 of the FPGA 1502 so that this logic 1516 can forward a tester report signal 1518 to the external tester. The logic is also operatively coupled to an internal memory storage portion 1520 of the FPGA as well as an external flash memory interface 1524 adapted to send and receive configuration and read/write signals 1526 to external flash memory.

Essentially, the FPGA implements the methodology in generally three stages: 1) channel calibration, 2) program level calibration through reference cell(s) data acquisition and processing, and 3) regular (or core) cell data acquisition and processing. During channel calibration, for example, the FPGA directs a user to connect a first calibration set of 8 resistors to emulate 10% of full-scale channel currents. Such commands may, for example, be generated from the instruction parameter 1508, tester command interpreter 1514 or native instruction execution control component 1508 of the FPGA, and the 8 resistors may comprise the loopback resistors 1050 (FIG. 10). The FPGA then measures, stores and calculates a first set of calibration parameters such as with the data vector processor 1504, serializer and resolution/report logic 1516 and the internal 1520 and/or external memory 1524, for example. The FPGA then directs the user to connect a second calibration set of 8 resistors to emulate 50% of full-scale channel currents. Such commands may again be generated from the instruction parameter 1508, tester command interpreter 1514 or native instruction execution control component 1508 of the FPGA, for example, and the 8 resistors may comprise additional loopback resistors 1050 (FIG. 10). The FPGA then measures, stores and calculates a second set of calibration parameters such as with the data vector processor 1504, serializer and resolution/report logic 1516 and the internal 1520 and/or external memory 1524, for example. It will be appreciated that channel calibration data is used in every cell measurement and is refreshed for every round of measurements.

During program level calibration, for example, the FPGA, via the data vector processor 1504 and/or resolution/report logic 1516, for example, detects the optimum level of programming voltage (Vg) using reference cells (e.g., corresponding to finding Vgate2 in acts 820–830 in FIG. 8B). The FPGA iteratively communicates results to an external tester via tester report signal 1518, and the tester adjusts the Vg and communicates to the FPGA about that via tester command signal 1515 until the optimum level Vgate2 is achieved. This level is used subsequently as the program level for the core cells. During regular operation, then, when Vgate2 is applied to the core cells, the FPGA reads the digitized measured current in each of the 8 channels via the 8 port vector processor 1504, where respective channel currents represent the degree of programming at one side of the MirrorBit cell. A decision is then made about the state of the memory cell (e.g., Level 1, 2, 3, or 4) via the data vector processor 1504 and serializer and resolution/report logic 1516. The result is communicated to the tester via the tester report signal 1518 as well as to the external flash memory interface 1524 for storage within external FLASH memory via FLASH signal 1526.

It is to be appreciated the term component as used herein can refer to a computer-related entity (e.g., hardware, a combination of hardware and software, software, software in execution, a process running on a processor, a processor, an object, an executable, a thread of execution, a program, a computer, an application running on a server, a server, a pipeline, a functional unit). Similarly, a system can refer to a structure comprising one or more modules, where a module comprises computer hardware and/or software (e.g. computer readable memory encoded with software instructions, computer configuration to carry out specified tasks, application program stored in computer readable memory, server on which an application runs, software object). Data may likewise refer to information that is in a useable format and/or that can be manipulated in a desired manner (e.g., by a computer). It is also to be appreciated that various aspects of the present invention may employ technologies associated with facilitating unconstrained optimization (e.g. back-propagation, Bayesian, Fuzzy Set, Non Linear regression, or other neural network paradigms including mixture of experts, cerebellar model arithmetic computer (CMACS), Radial Basis Functions, directed search networks, and functional link nets).

Although the invention has been shown and described with respect to one or more implementations, equivalent alterations and modifications will occur to others skilled in the art based upon a reading and understanding of this specification and the annexed drawings. The invention includes all such modifications and alterations. With regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein simply means an example, rather than the best.

What is claimed is:

1. An architecture adapted to determine a level of a bit in a multi-level memory cell, comprising:
    a current conversion component operative to convert a measured current from the cell into a corresponding analog voltage;
    an analog to digital (A/D) converter operative to convert the analog voltage into a digital value; and
    a data processor adapted to determine the level of the bit from the digital value, wherein the data processor is implemented as a field programmable gate array (FPGA), and wherein the FPGA comprises:
    a data vector processor operative to facilitate a determination of the level of the bit by comparing the digital value to predetermined criteria.

2. The architecture of claim 1, wherein the FPGA further comprises:
    a FLASH memory interface operatively coupled to the data vector processor and adapted to facilitate storage of the bit level in external FLASH memory via a FLASH signal indicative of the bit level.

3. The architecture of claim 1, wherein the A/D converter is an 8 bit converter.

4. The architecture of claim 1, wherein the FPGA further comprises:
    report logic operatively coupled to the data vector processor and adapted to send a tester report signal to an external tester indicative of the bit level.

5. The architecture of claim 4, wherein the FPGA facilitates a determination of a gate voltage Vgate2 that produces the measured current when applied to a gate of the cell.

6. The architecture of claim 5, wherein the FPGA causes an initial voltage to be applied to the gate of the cell and then iteratively increased until the gate voltage Vgate2 is determined.

7. The architecture of claim 6, wherein the data vector processor facilitates a determination that Vgate2 is equal to the most recently applied voltage when a current resulting from the most recently applied voltage satisfies one or more predetermined criteria.

8. The architecture of claim 6, wherein the initial gate voltage is increased by about 100 millivolts until the gate voltage Vgate2 is determined.

9. The architecture of claim 6, wherein the FPGA further comprises:
    a tester command interpreter adapted to receive a tester command signal from the external tester indicative of the initial voltage to be applied to the gate of the cell.

10. The architecture of claim 9, wherein the iterative increase of the gate voltage is controlled by a tester command signal from the external tester.

11. The architecture of claim 1, wherein the current conversion component comprises:
    a transimpedance amplifier operative to convert the measured current into a voltage value that is also elevated (offset) as a function of a voltage applied to the cell in order to produce the current that is measured; and
    a differential amplifier downstream of the transimpedance amplifier operative to match the elevated (offset) voltage value to requirements posed by other downstream components in the channel, as well as to further amplify the signal.

12. The architecture of claim 11, further comprising:
    a clock generator operatively coupled to the FPGA to facilitate clocking data through the architecture.

13. The architecture of claim 1, further comprising:
    a relay operative to selectively couple the measured current to the current conversion component.

14. The architecture of claim 13, further comprising:
    a selectively energizeable coil operatively associated with the relay to control activation of the relay.

15. The architecture of claim 14, wherein the coil is controlled by the FPGA.

* * * * *